(12) United States Patent
Yeo et al.

(10) Patent No.: US 10,679,538 B2
(45) Date of Patent: *Jun. 9, 2020

(54) HAPTIC DISPLAY DEVICE

(71) Applicant: Samsung Display Co., Ltd., Yongin-si, Gyeonggi-do (KR)

(72) Inventors: Yong-Seok Yeo, Yongin-si (KR); Yi-Joon Ahn, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 117 days.

This patent is subject to a terminal disclaimer.

(21) Appl. No.: 15/891,215

(22) Filed: Feb. 7, 2018

(65) Prior Publication Data
US 2018/0165999 A1   Jun. 14, 2018

Related U.S. Application Data

(63) Continuation of application No. 13/925,602, filed on Jun. 24, 2013, now Pat. No. 9,934,711.

(30) Foreign Application Priority Data

Jun. 29, 2012  (KR) .......................... 10-2012-0071129
Feb. 25, 2013  (KR) .......................... 10-2013-0019948

(51) Int. Cl.
*G09G 3/02*   (2006.01)
*G09B 21/00*  (2006.01)
(Continued)

(52) U.S. Cl.
CPC ............. *G09G 3/02* (2013.01); *G06F 1/1601* (2013.01); *G06F 3/016* (2013.01); *G06F 3/041* (2013.01);
(Continued)

(58) Field of Classification Search
CPC ..... G09B 21/004; G06F 3/016; G06F 1/1601; G06F 3/0412; G06F 3/041; G06F 2203/014; H03K 2217/96062; G05B 2219/40619
See application file for complete search history.

(56) References Cited

U.S. PATENT DOCUMENTS 7,649,578 B2   1/2010  Kwon et al.
2002/0097194 A1  7/2002  Uchida et al.
(Continued)

FOREIGN PATENT DOCUMENTS

CN    101026183 B   6/2011
CN    10151618 B    6/2012
(Continued)

OTHER PUBLICATIONS

Extended European Search Report for European Application No. EP 13 174 178.7 which shares priority of Korean Patent Application Nos. KR 10-2012-0071129 and KR 10-2013-0019948 with the subject U.S. Application.
(Continued)

*Primary Examiner* — Patrick N Edouard
*Assistant Examiner* — Douglas M Wilson
(74) *Attorney, Agent, or Firm* — Lewis Roca Rothgerber Christie LLP

(57) ABSTRACT

A haptic display device is disclosed. In one aspect, the device includes a plurality of scan lines disposed over a substrate and configured to transfer a scan signal and a plurality of data lines electrically insulated from the scan lines and configured to transfer a data signal, wherein the data lines cross the scan lines. The device also includes a plurality of haptic control lines electrically insulated from the scan lines or the data lines and configured to transfer a haptic signal and a thin film transistor electrically connected
(Continued)

to the scan lines and the data lines, wherein the thin film transistor is formed in each of a plurality of pixels. The device further includes a first electrode electrically connected to the thin film transistor, a second electrode facing the first electrode and an optical adjustment member disposed between the first and second electrodes.

17 Claims, 28 Drawing Sheets

(51) Int. Cl.
*G06F 1/16* (2006.01)
*G06F 3/01* (2006.01)
*G06F 3/041* (2006.01)
*H01L 27/32* (2006.01)

(52) U.S. Cl.
CPC ......... *G06F 3/0412* (2013.01); *G09B 21/004* (2013.01); *G06F 2200/1612* (2013.01); *H01L 27/3246* (2013.01)

(56) References Cited

U.S. PATENT DOCUMENTS

| | | | |
|---|---|---|---|
| 2006/0001792 A1* | 1/2006 | Choi | G02F 1/13458 349/54 |
| 2007/0035239 A1* | 2/2007 | Kang | H01L 27/124 313/504 |
| 2007/0194705 A1 | 8/2007 | Sung et al. | |
| 2007/0236429 A1* | 10/2007 | Tseng | G09G 3/3225 345/81 |
| 2007/0278480 A1* | 12/2007 | Hwang | H01L 27/3244 257/40 |
| 2008/0054796 A1* | 3/2008 | Sung | H01L 27/3276 313/504 |
| 2008/0062148 A1 | 3/2008 | Hotelling et al. | |
| 2008/0079005 A1* | 4/2008 | Tseng | H01L 27/3272 257/72 |
| 2008/0218488 A1 | 9/2008 | Yang et al. | |
| 2009/0167704 A1* | 7/2009 | Terlizzi | G06F 3/016 345/173 |
| 2009/0256689 A1 | 10/2009 | Nakaya et al. | |
| 2010/0295818 A1 | 11/2010 | Lin et al. | |
| 2011/0042697 A1* | 2/2011 | Lee | H01L 27/322 257/89 |
| 2011/0193802 A1* | 8/2011 | Park | G02F 1/133615 345/173 |
| 2012/0038470 A1 | 2/2012 | Kim et al. | |
| 2012/0068957 A1 | 3/2012 | Puskarich et al. | |
| 2012/0168756 A1 | 7/2012 | Ryu et al. | |
| 2012/0262406 A1 | 10/2012 | Hotelling et al. | |
| 2013/0335338 A1* | 12/2013 | Lai | G06F 3/0412 345/173 |
| 2014/0002427 A1 | 1/2014 | Yeo et al. | |

FOREIGN PATENT DOCUMENTS

| | | |
|---|---|---|
| JP | 2000-148393 A | 5/2000 |
| JP | 2000-259349 A | 9/2000 |
| JP | 2002-304136 A | 10/2002 |
| JP | 2004-319255 A | 11/2004 |
| JP | 2005-267080 A | 9/2005 |
| JP | 2007-219518 A | 8/2007 |
| JP | 2008-146649 A | 6/2008 |
| JP | 2009-199083 A | 9/2009 |
| JP | 2009-199093 A | 9/2009 |
| JP | 2009-258309 A | 11/2009 |
| JP | 2010-231773 A | 10/2010 |
| JP | 2011-2926 A | 1/2011 |
| JP | 2012-027765 A | 2/2012 |
| KR | 10-0182050 | 12/1998 |
| KR | 10-2007-0073125 A | 7/2007 |
| KR | 10-2010-0065816 A | 6/2010 |
| KR | 10-2010-0074820 A | 7/2010 |
| KR | 10-2011-0038915 A | 4/2011 |
| KR | 10-2011-0092778 A | 8/2011 |
| TW | 200917103 | 4/2009 |

OTHER PUBLICATIONS

Chinese Office Action dated Mar. 17, 2017 for Chinese Patent Application No. CN 201310268412.9 which shares priority of Korean Patent Application Nos. KR 10-2012-0071129 and KR 10-2013-0019948 with the subject U.S. Application.

Japanese Office Action dated Mar. 28, 2017 for Japanese Patent Application No. JP 2013-127537, which shares priority of Korean Patent Application Nos. KR 10-2012-0071129 and KR 10-2013-0019948 with the subject U.S. Application.

Japanese Notice of Allowance dated Oct. 3, 2017 for Japanese Patent Application No. JP 2013-127537, which cites the above-identified reference numbered 1, and which shares priority of Korean Patent Application Nos. KR 10-2012-0071129, filed Jun. 29, 2012; and KR 10-2013-0019948, filed Feb. 25, 2013 with the subject U.S. Application.

\* cited by examiner

HAPTIC DISPLAY DEVICE

CROSS-REFERENCE TO RELATED APPLICATIONS

Any and all priority claims identified in the Application Data Sheet, or any correction thereto, are hereby incorporated by reference under 37 CFR 1.57. For example, this application is a continuation of U.S. patent application Ser. No. 13/925,602, filed Jun. 24, 2013, which claims priority to and the benefit of Korean Patent Application No. 10-2012-0071129 and 10-2013-0019948 filed in the Korean Intellectual Property Office on Jun. 29, 2012 and Feb. 25, 2013, the entire contents of which are incorporated herein by reference.

BACKGROUND

(a) Field

The described technology generally relates to a haptic display device.

(b) Description of the Related Technology

There are several different types of display devices including liquid crystal displays (LCD), plasma displays, and organic light emitting diode (OLED) displays.

To improve user interfaces, displays have been combined with other types of feedback systems. These feedback systems may rely on audio and visual feedback. A popular trend is to provide feedback through the sense of touch; this method of feedback is called haptic or tactile feedback. Haptic feedback is felt when human fingertips touch an object; this includes tactile feedback that is felt when skin contacts a surface of an object. One type of haptic feedback is kinesthetic force feedback. Kinesthetic force feedback is felt when movement of joints and muscles are impeded. In order to provide the haptic effect, a haptic actuator such as a vibration component is used. The haptic actuator is generally embedded in a separate mounting space. Often in mobile devices, the amount of space available for a haptic actuator is limited due to miniaturization of all components in the device. When a haptic actuator is used with a flexible display, it can make the display difficult to bend.

SUMMARY

One inventive aspect is a haptic display device having advantages of enabling miniaturization, slimming, and bending. Another aspect is a haptic display device which includes: a substrate; a plurality of scan lines provided on the substrate to transfer a scan signal; a plurality of data lines electrically insulated from the scan lines while crossing the scan lines to transfer a data signal; a plurality of haptic control lines insulated from the scan lines or the data lines to transfer a haptic signal; a thin film transistor electrically connected to the scan lines and the data lines and provided in a plurality of pixels arranged in a matrix pattern; a first electrode electrically connected to the thin film transistor; a second electrode facing the first electrode; and an optical adjustment member provided between the first electrode and the second electrode.

The haptic control line may be provided on a same layer with the first electrode.

The haptic control line may be provided parallel with the data line.

A haptic member may be provided at a crossing region between the haptic control line and the scan line.

There can be as many haptic members as there are data lines. Alternatively, there can be fewer haptic members than data lines.

A haptic member may be provided between the haptic control line and the second electrode.

The haptic control line may be provided parallel with the scan line, and a haptic member may be provided at a crossing region between the data line and the haptic control line.

The number of the haptic control lines can equal the number of the scan lines. Alternatively, there can be a smaller number of haptic control lines than scan lines.

A haptic member may be provided between the haptic control line and the second electrode.

The haptic control line may be provided on a same layer with the scan line, the haptic control line may be provided parallel with the scan line, and a haptic member may be provided between the haptic control line and the data line.

A haptic member may be provided between the haptic control line and the first electrode, and a haptic member may be provided between the haptic control line and the second electrode.

The haptic control line may be provided on a same layer with the data line, the haptic control line may be provided parallel with the data line, and a haptic member may be provided between the scan line and the haptic control electrode.

A haptic member may be provided between the haptic control line and the first electrode, and a haptic member may be provided between the haptic control line and the second electrode.

Further, a haptic display device according to another exemplary embodiment of the present invention includes: a substrate; a plurality of scan lines provided on the substrate to transfer a scan signal; a plurality of data lines electrically insulated from the scan lines while crossing the scan lines to transfer a data signal; a plurality of driving power lines electrically insulated from the scan line while crossing the scan line to transfer a driving voltage; a plurality of haptic control lines electrically insulated from the scan lines or the data lines to transfer a haptic signal; a switching thin film transistor electrically connected to the scan line and the data line; a driving transistor electrically connected to the switching thin film transistor and the driving power line; a first electrode electrically connected to the driving transistor; an organic light emitting diode provided on the first electrode; and a second electrode provided on the organic light emitting diode.

The haptic control line may be provided on a same layer with the first electrode, the haptic control line may be provided parallel with the data line, and a haptic member is provided at a crossing region between the haptic control line and the scan line.

In one embodiment, the haptic control line and the haptic member are formed inside the haptic display device, so that the haptic display device can be miniaturized and slimmed.

DETAILED DESCRIPTION

Figure 1:
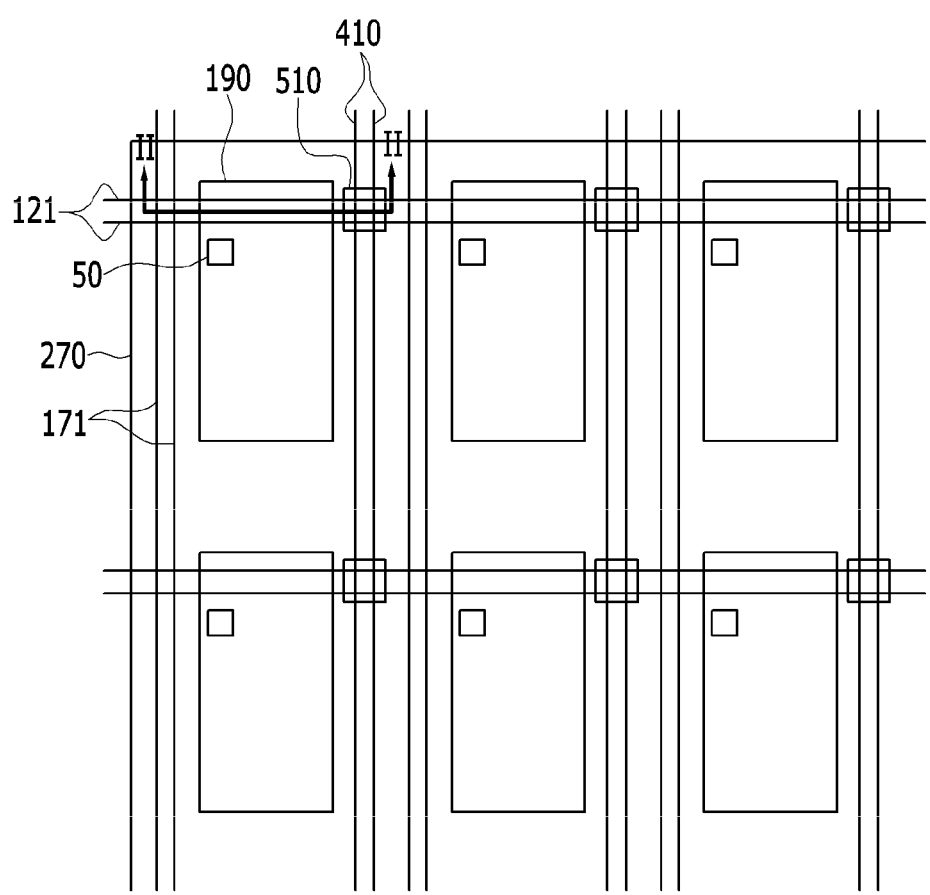
FIG. 1 is a layout view illustrating a haptic display device according to one embodiment.
Figure 2:
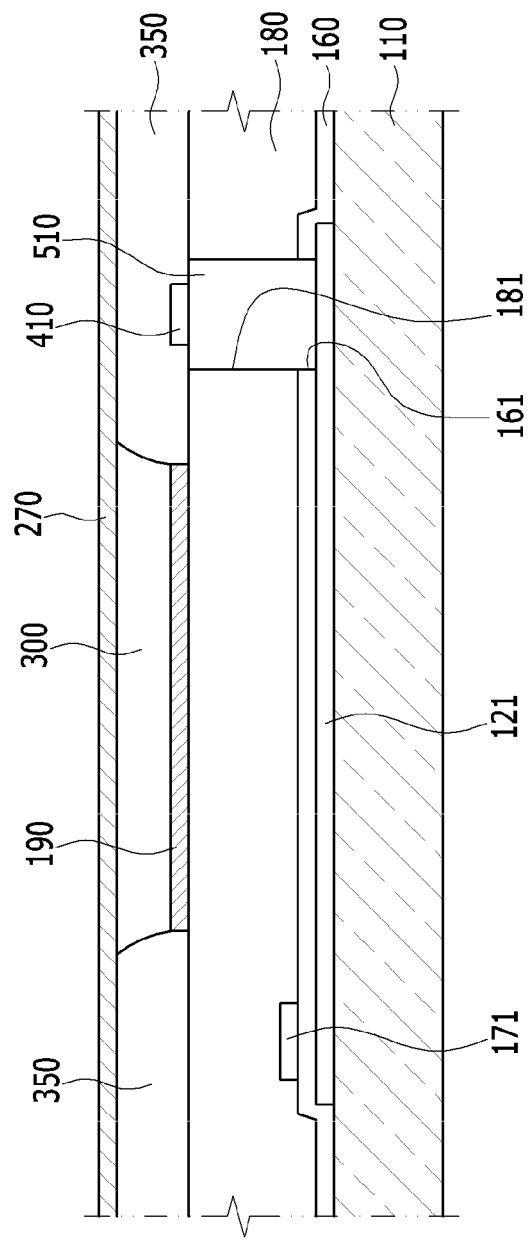
FIG. 2 is a cross-sectional view taken along line II-II of FIG. 1.

FIG. 1 is a layout view illustrating a haptic display device according to one exemplary embodiment, and FIG. 2 is a cross-sectional view taken along line II-II of FIG. 1.

As shown in FIGS. 1 and 2, the haptic display device includes i) a substrate 110, ii) a plurality of scan lines 121 to transfer a scan signal, iii) a plurality of data lines 171 to transfer a data signal, iv) a plurality of haptic control lines 410 to transfer a haptic signal, v) a thin film transistor 50, vi) a first electrode 190, and vii) a second electrode 270. The plurality of scan lines 121 are provided on the substrate 110. The data lines 171 are electrically insulated from the scan lines while crossing the scan lines 121. The thin film transistor 50 is electrically connected to the scan lines 121 and the data lines 171. The first electrode 190 is electrically connected to the thin film transistor 50. The second electrode faces the first electrode 190.

The substrate 110 may include an insulation substrate made of glass, quartz, a ceramic material, or a plastic material.

The scan lines 121 longitudinally extend in a row direction. A buffer layer (not shown) is formed between the substrate 110 and the scan lines 121 to prevent infiltration of impurity elements, and to planarize a surface of the substrate 110, and the scan lines 121 may be made of silicon nitride (SiNx), silicon oxide ($SiO_2$), or silicon oxinitride (SiOxNy).

An interlayer insulating layer 160 is formed between the scan lines 121 and the data lines 171 to insulate the scan lines 121 and the data lines 171 from each other. The interlayer insulating layer 160 may be made of silicon nitride (SiNx), or silicon oxide ($SiO_2$).

The data lines 171 longitudinally extend in a column direction vertical to the scan lines 121, and a protective layer 180 is formed on the data lines 171.

The thin film transistors 50 are formed in a plurality of pixels arranged in a matrix pattern. Each of the thin film transistors 50 includes a separate semiconductor layer (not shown), a gate electrode connected to the scan lines 121, and a source electrode and a drain electrode connected to the data lines 171.

The semiconductor layer may include a polysilicon or oxide semiconductor. The oxide semiconductor may include one of titanium (Ti), hafnium (Hf), zirconium (Zr), aluminum (Al), tantalum (Ta), germanium (Ge), zinc (Zn), gallium (Ga), tin (Sn) or indium (In)-based oxide, zinc oxide (ZnO), indium-gallium-zinc oxide ($InGaZnO_4$), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), hafnium-indium-zinc oxide (Hf—In—Zn—O) being a composite oxide thereof. When the semiconductor layer is made of an oxide semiconductor, a separate protective layer may be provided to protect the oxide semiconductor weak against peripheral environments such as high temperature.

The first electrode 190 is provided on the protective layer 180. A barrier rib 350 exposing the first electrode 190 is formed close to the edge of the first electrode 190. An optical adjustment member 300 may be formed between the first electrode 190 and the second electrode 270. The optical adjustment member 300 may include a liquid crystal layer or an organic emission layer.

In some embodiments, the haptic control line 410 is insulated from the scan line 121, is provided on the same layer with the first electrode 190, and is substantially parallel with the data line 171.

In some embodiment, a haptic member 510 is formed at the crossing region between the scan line 121 in a row direction and the haptic control line 410 in a column direction. The haptic members 510 are provided between the scan line 121 and the haptic control line 410, and the haptic members 510 are placed in haptic holes 161 and 181, which are formed in an interlayer insulating layer 160 and protective layer 180 between the scan line 121 and the haptic control line 410, respectively. Since there is the same number of haptic control lines 410 as there are data lines 171, there can be the same number of haptic members 510 as pixels. The haptic member 510 may have a size of several μm. This haptic member 510 can be formed using an injection printing process of directly dropping and curing the haptic member 510 on the substrate by an injection printing device.

In some embodiments, the haptic member 510 includes an Electro Active Polymer (EAP), a Piezo material, and a material which may physically expand or contract due to a potential difference. For example, the haptic member 510 includes Polyvinylidene fluoride (PVDF), Polydimethyl siloxane (PDMS), and Polyvinylidene fluoride-co-trifluoroethylene (PVFT).

In some embodiments, the Piezo material used for the haptic member 510 includes vivi touch from Bayer Ltd., and VHB 4910 from 3M Ltd. The VHB 4910 from 3M Ltd. corresponds to an Acrylic elastomer.

When there is a difference in voltage between the scan line 121 in a lower portion of the haptic member 510 and the haptic control line 410 in an upper portion of the haptic member 510, the height of the haptic member 510 is changed by Coulomb force. This is due to polarization of EAP constituting the haptic member 510, and haptic vibration is generated using the change in the height of the haptic member 510.

The haptic control line 410 and the haptic member 510 are inside the display device. Accordingly, since a separate haptic actuator is not required, the haptic display device may be miniaturized and slimmed. The device can be used in a flexible display.

Further, since there is the same number of haptic members 510 as the number of pixels, the haptic resolution can be improved.

Although a separate haptic control line 410 is shown in this embodiment, the scan line 121 or the data line 171 may be used as the haptic control line. In this case, a separate reference electrode line may be provided to generate a voltage difference that in turn generates a haptic vibration.

In addition, although there is the same number of haptic control lines 410 as the data lines 171 in this embodiment, a smaller number of haptic control lines 410 than the data lines 171 may be provided in a different embodiment.

Figure 3:
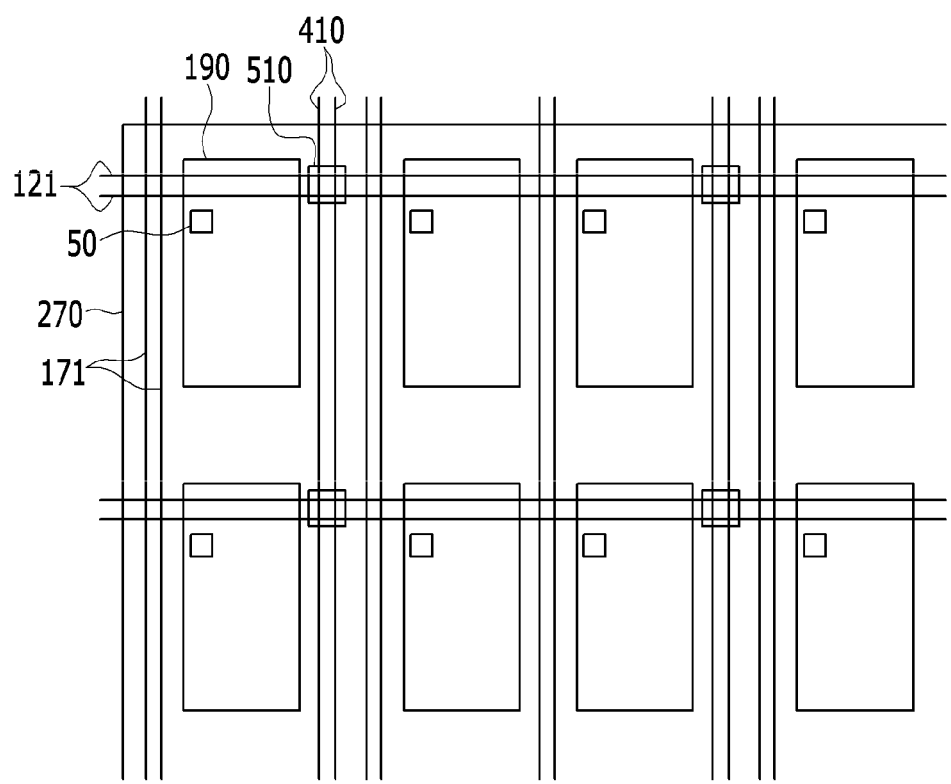
FIG. 3 is a layout view illustrating a haptic display device according to another embodiment.

FIG. 3 is a layout view illustrating a haptic display device according to another embodiment.

As shown in FIG. 3, there are a smaller number of haptic control lines 410 than data lines 171. There is one haptic control line 410 for every two data lines 171 in this embodiment. There are fewer haptic members in this embodiment then in the preceding embodiment. Since vibration by the haptic member 510 is recognized by tactile sensation, the finger can sufficiently recognize the haptic vibration, even if the haptic member 510 is smaller than that of the finger and is formed only in some of the pixels.

Meanwhile, although the haptic member 510 is in between the scan line 121 and the haptic control line 410 in one embodiment, the haptic member 510 may be provided between the haptic control line 410 and the second electrode 270 in a different embodiment.

Figure 4:
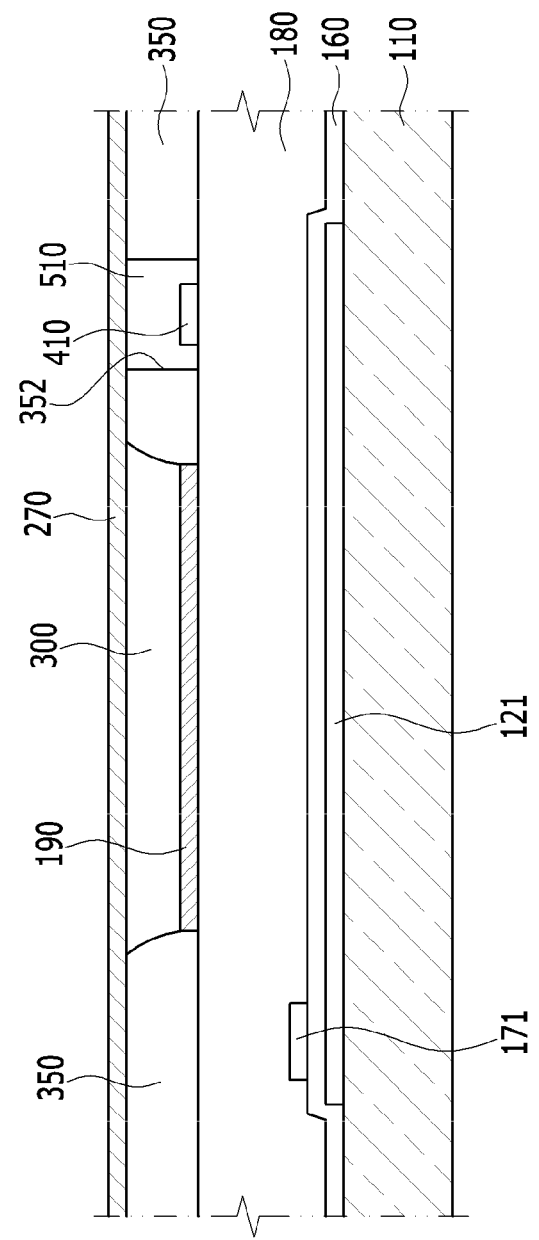
FIG. 4 is a cross-sectional view taken along line II-II of FIG. 1 according to another embodiment.

FIG. 4 is a cross-sectional view taken along line II-II compatible with the embodiment of FIG. 1.

As shown in FIG. 4, a haptic member 510 is provided between a haptic control line 410 and the second electrode 270, and the haptic member 510 is filled in a haptic hole 352, which is formed between the haptic control line 410 and the second electrode 270. Since there is the same number of haptic control lines 410 as data lines 171, there can be the same number of haptic members 510 as the number of pixels.

When there is a difference in potential (or voltage) between the scan line 121 and the second electrode 270, because of a haptic signal applied to the haptic control line 410, the height of the haptic member 510 is changed by Coulomb force. This is due to polarization of EAP constituting the haptic member 510, and haptic vibration is generated using the change in the height of the haptic member 510.

The haptic control line can be substantially parallel with the data line or the scan line.

Figure 5:
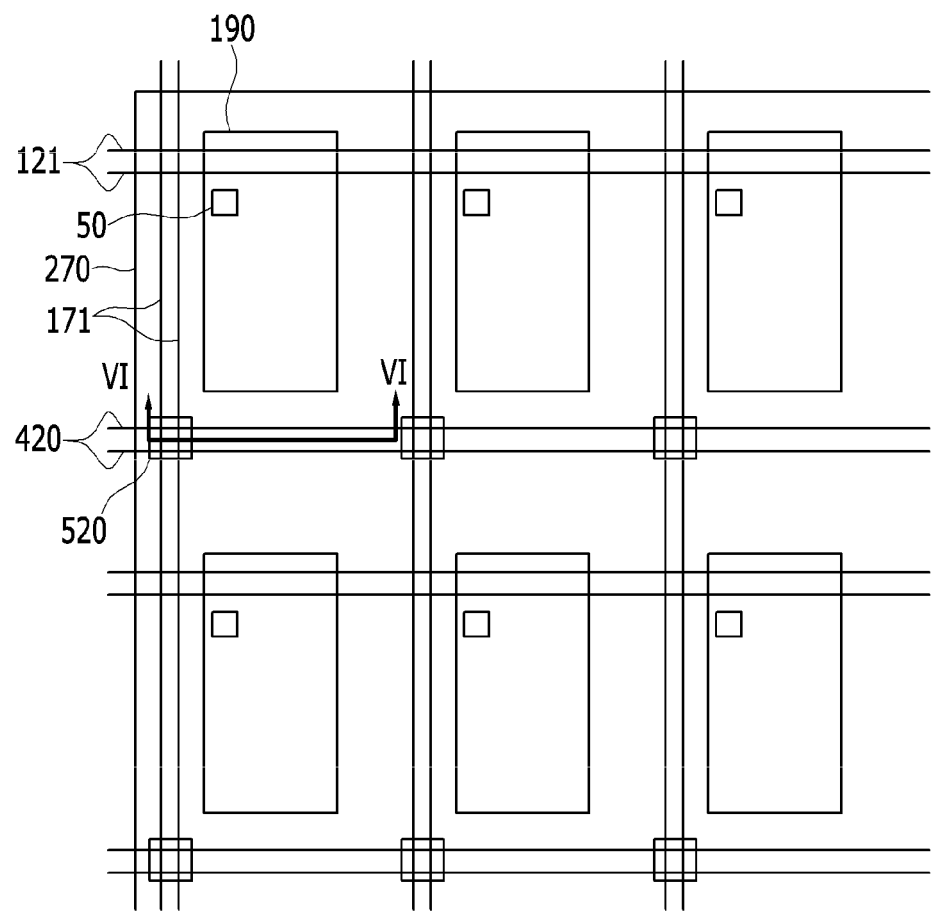
FIG. 5 is a layout view illustrating a haptic display device according to another embodiment.
Figure 6:
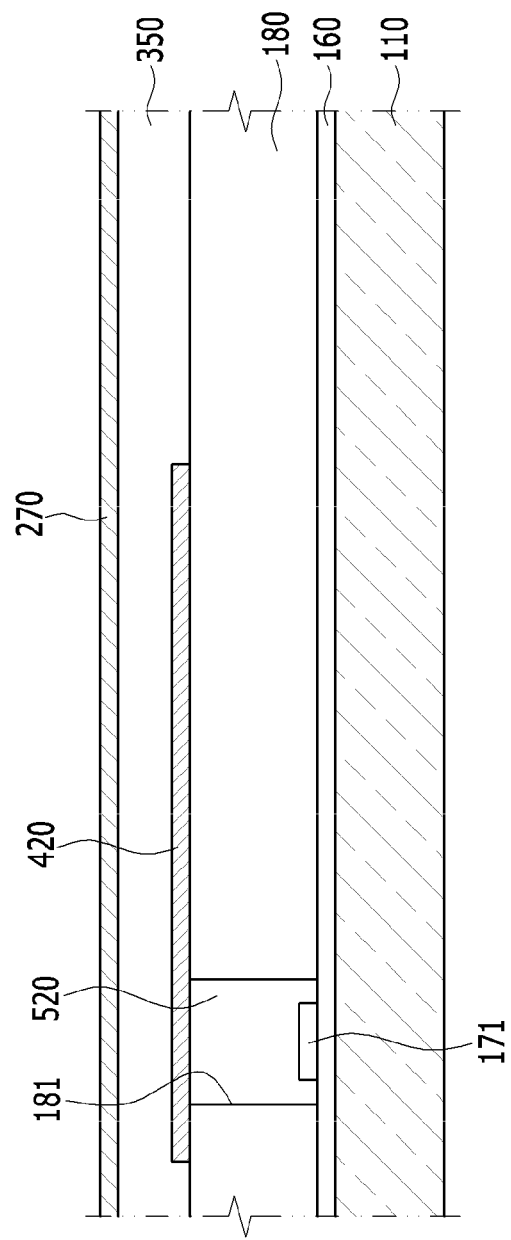
FIG. 6 is a cross-sectional view of the haptic display device taken along line VI-VI of FIG. 5.

FIG. 5 is a layout view illustrating a haptic display device according to another embodiment and FIG. 6 is a cross-sectional view of the haptic display device taken along line VI-VI of FIG. 5.

As shown in FIGS. 5 and 6, the haptic control line 420 is insulated from the data line 171 and is provided on the same layer with the first electrode 190 parallel with the scan line 121.

A haptic member 520 is provided at a crossing region between the data line in a column direction and a haptic control line 420 in the row direction. The haptic member 520 is provided between the data line 171 and the haptic control line 420, and a haptic member 520 is filled in a haptic hole 181, which is formed in a protective layer 180 between the data line 171 and the haptic control line 420. Since there is the same number of haptic control lines 420 as scan lines 121, the number of haptic members 520 can be the same as the number of pixels.

When there is a difference in potential (or voltage) between the data line 171 provided at a lower portion of the haptic member 520 and the haptic control line 420 provided at an upper portion of the haptic member 520, as a haptic signal is applied to the haptic control line 420, the height of the haptic member 520 is changed by Coulomb force, due to polarization of EAP constituting the haptic member 520, and haptic vibration is generated using the change in the height of the haptic member 520.

In addition, although there is the same number of haptic control lines as scan lines in this embodiment, there can be a smaller number of haptic control lines than the scan lines.

Figure 7:
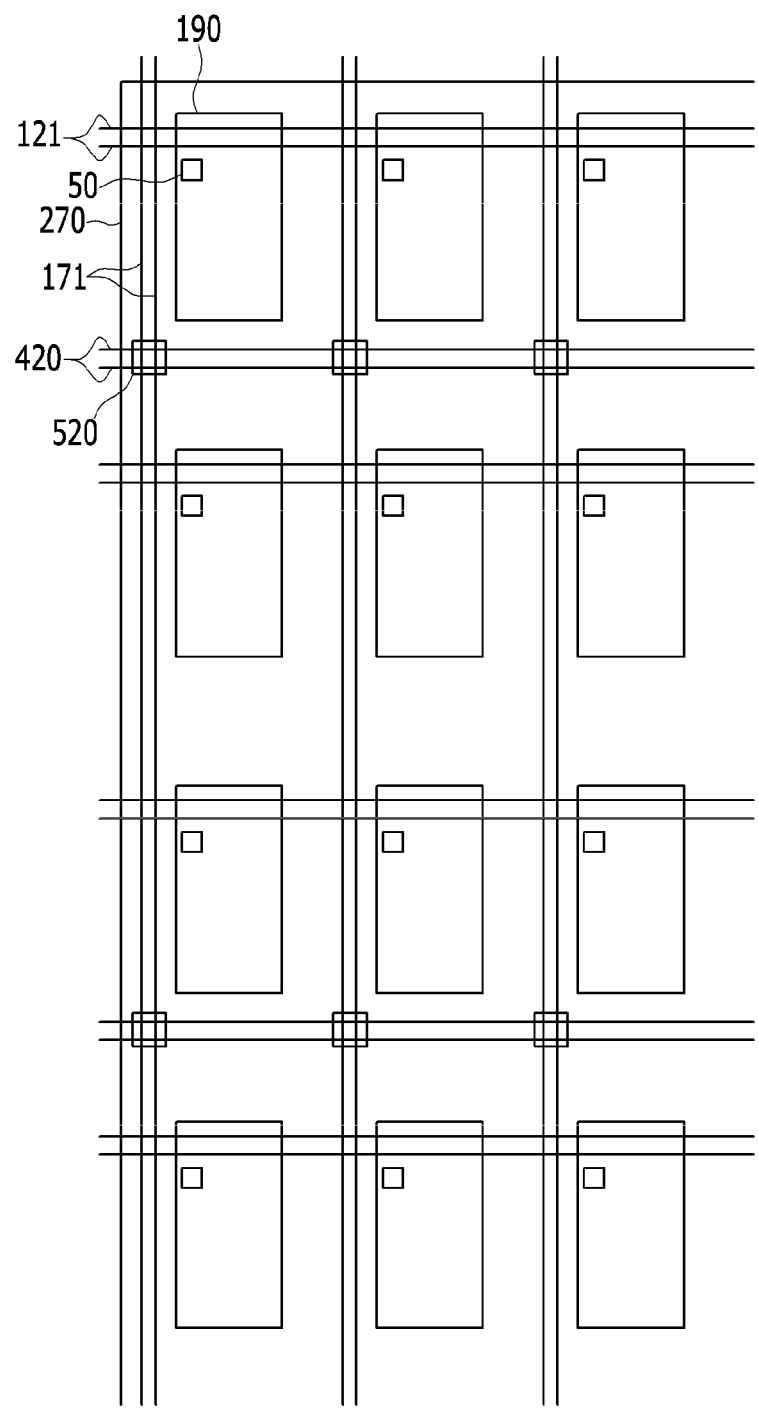
FIG. 7 is a layout view illustrating a haptic display device according to another embodiment.

FIG. 7 is a layout view illustrating a haptic display device according to another embodiment.

As shown in FIG. 7, there is a smaller number of haptic control lines 420 than the scan lines 121. FIG. 7 shows one haptic control line 420 for every two scan line. Accordingly, the number of haptic members 520 provided at a crossing region between the haptic control line 420 and the scan line 121 becomes smaller than that of the embodiment shown in FIGS. 5 and 6. Since vibration by the haptic member 520 is recognized by tactile sensation such as a finger, even if the haptic member 520 having the size very smaller than that of the finger is formed only in some of the pixels, the finger may sufficiently recognize the haptic vibration.

The haptic member 520 may be provided between the haptic control line 420 and the second electrode 270 in the present embodiment.

Figure 8:
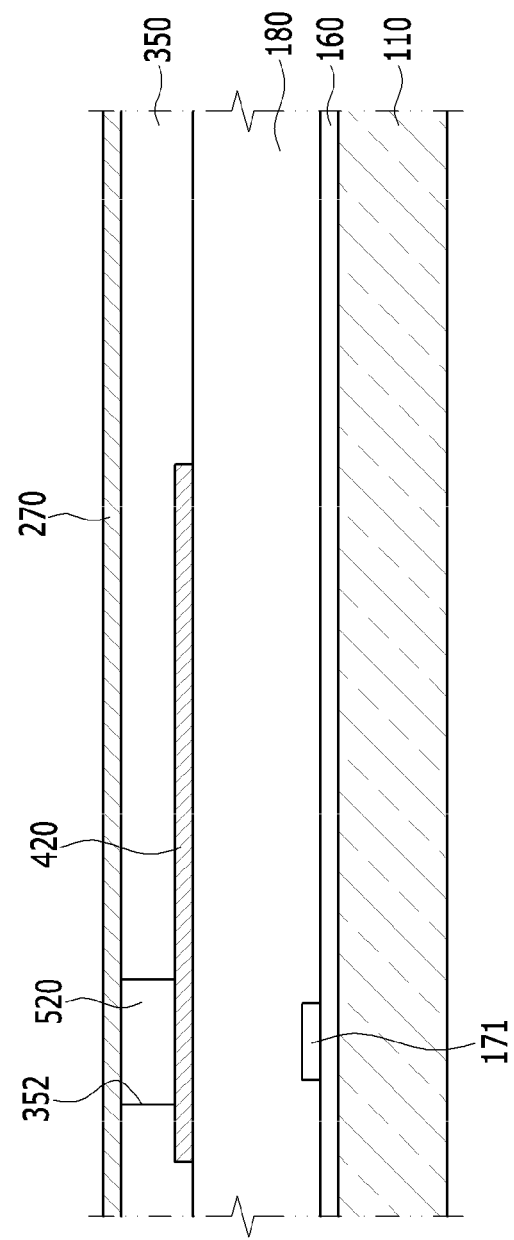
FIG. 8 is a cross-sectional view taken along line VI-VI of FIG. 5 according another embodiment.

FIG. 8 is a cross-sectional view taken along line VI-VI of FIG. 5.

As shown in FIG. 8, the haptic member 520 is provided between a haptic control line 420 which is provided on the same layer with the first electrode 190 and the second electrode 270. The haptic member 510 is filled in a haptic hole 352, which is formed in a barrier rib 350 between the haptic control line 420 and the second electrode 270.

When there is a difference in potential (or voltage) between the haptic control line 420 at a lower portion of the haptic member 520 and the second electrode 270 at an upper portion of the haptic member 520 as a haptic signal is applied to the haptic control line 420, the height of the haptic member 520 is changed so that a haptic vibration is generated.

Although the haptic control line is on the same layer with the first electrode in one embodiment, a haptic control line can be on the same layer with a scan line in another embodiment.

Figure 9:
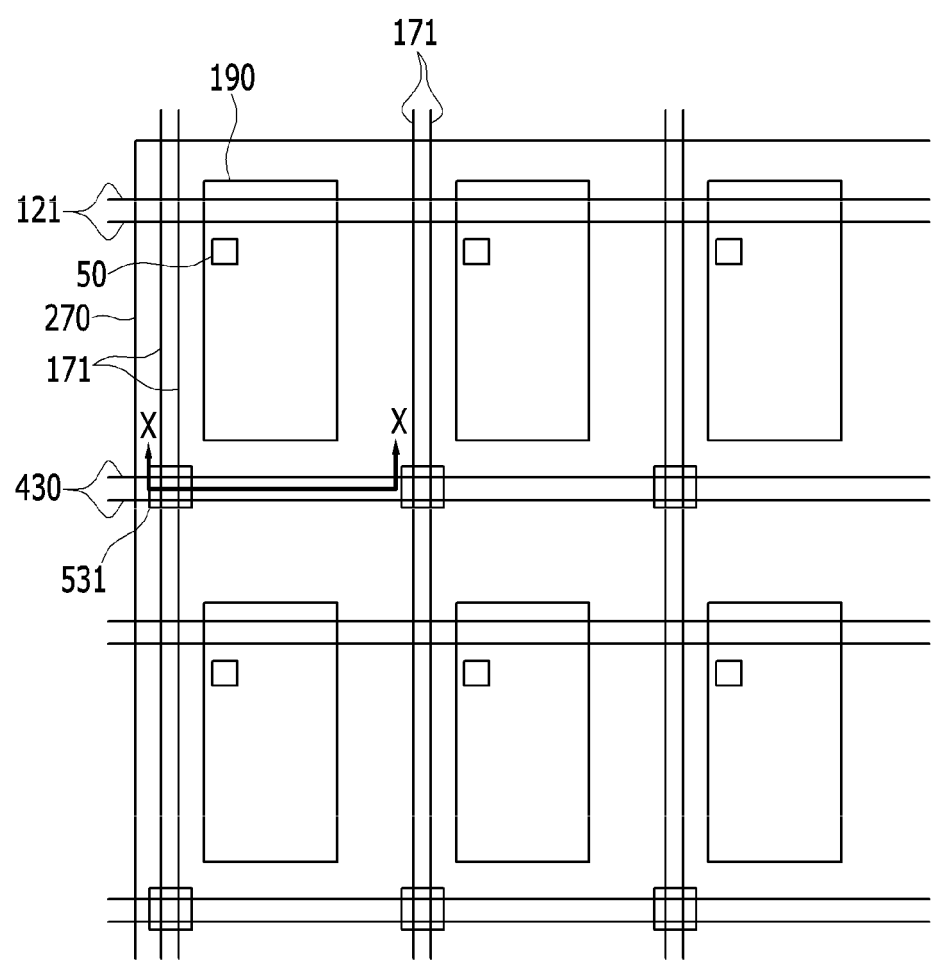
FIG. 9 is a layout view illustrating a haptic display device according to another embodiment.
Figure 10:
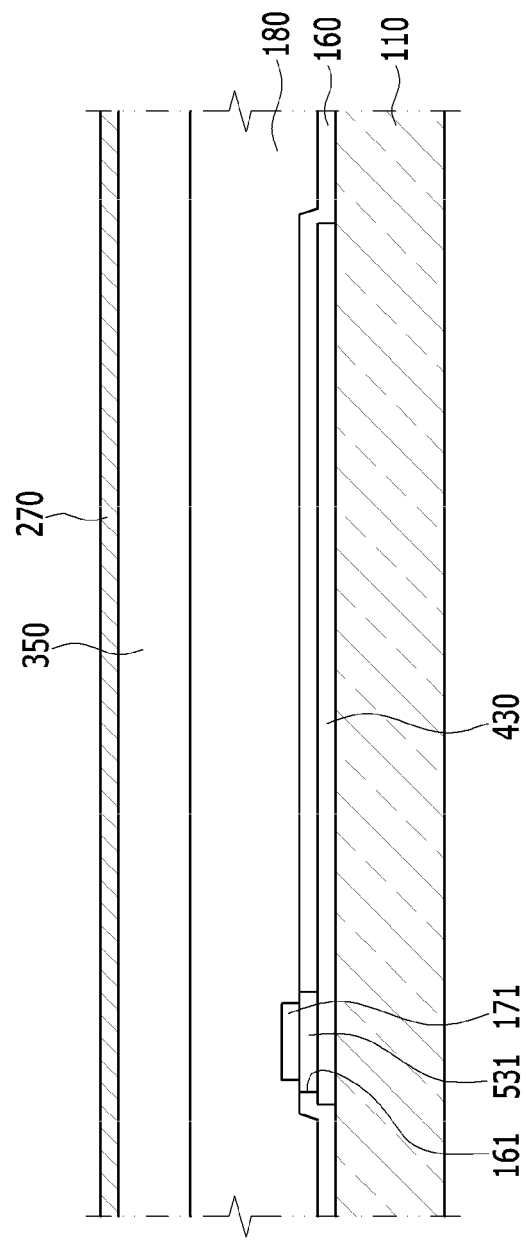
FIG. 10 is a cross-sectional view of the haptic display device taken along line X-X of FIG. 9.

FIG. 9 is a layout view illustrating a haptic display device according to another embodiment and FIG. 10 is a cross-sectional view of the haptic display device taken along line X-X of FIG. 9.

As shown in FIGS. 9 and 10, the haptic control line 430 is insulated from the data line 171 and is on the same layer with the scan line 121 parallel with the scan line 121.

A haptic member 531 is formed at the crossing region between the data line 171 in a column direction and the haptic control line 430 in a row direction. The haptic member 531 is disposed between the data line 171 and the haptic control line 430. The haptic member 531 is filled in a haptic hole 161, which is formed in an interlayer insulating layer 160 between a data line 171 and the haptic control line 430. There can be the same number of the haptic control lines 430 as the scan lines 121 or a smaller number of the haptic control lines 430 than the scan lines 121.

When there is a difference in potential between the haptic control line 430 at the lower portion of the haptic member 531 and the data line 171 at the upper portion of the haptic member 531, as a haptic signal is applied to the haptic control line 430, the height of the haptic member 531 is changed by Coulomb force due to polarization of EAP constituting the haptic member 531. A haptic vibration is generated using the change in the height of the haptic member 531.

Although the haptic member is formed between the haptic control line and the data lined in one embodiment, the haptic member can be formed between the haptic control line and the second electrode and between the haptic control line and the first electrode in different embodiments.

Figure 11:
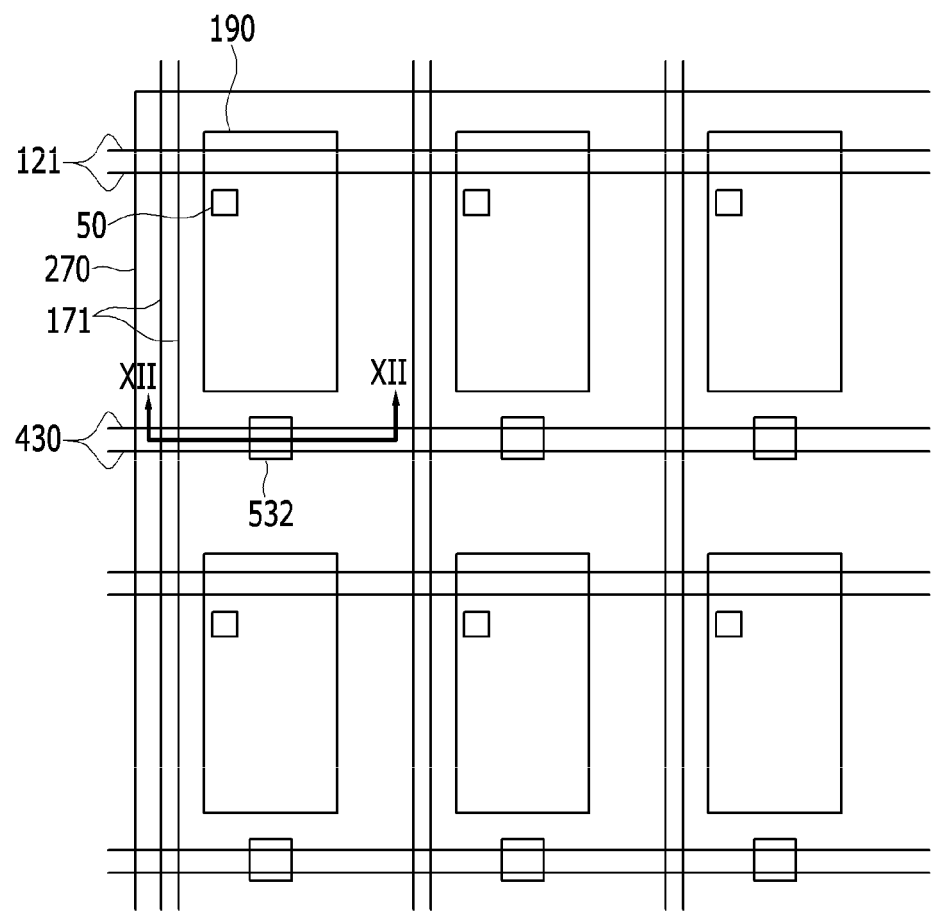
FIG. 11 is a layout view illustrating a haptic display device according to another embodiment.
Figure 12:
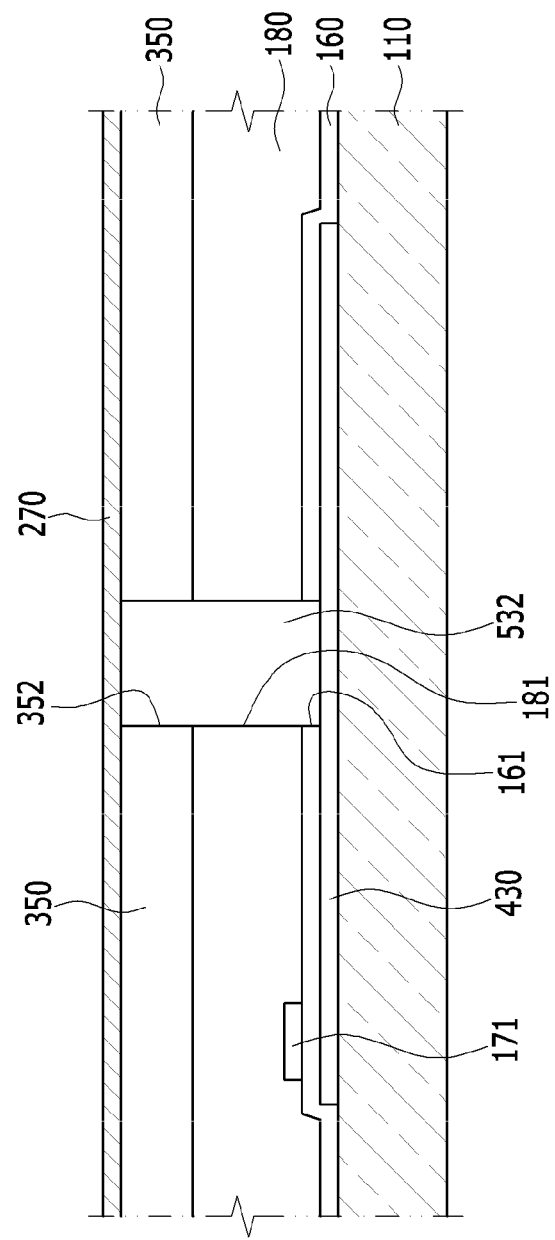
FIG. 12 is a cross-sectional view of the haptic display device taken along line XII-XII of FIG. 11.
Figure 13:
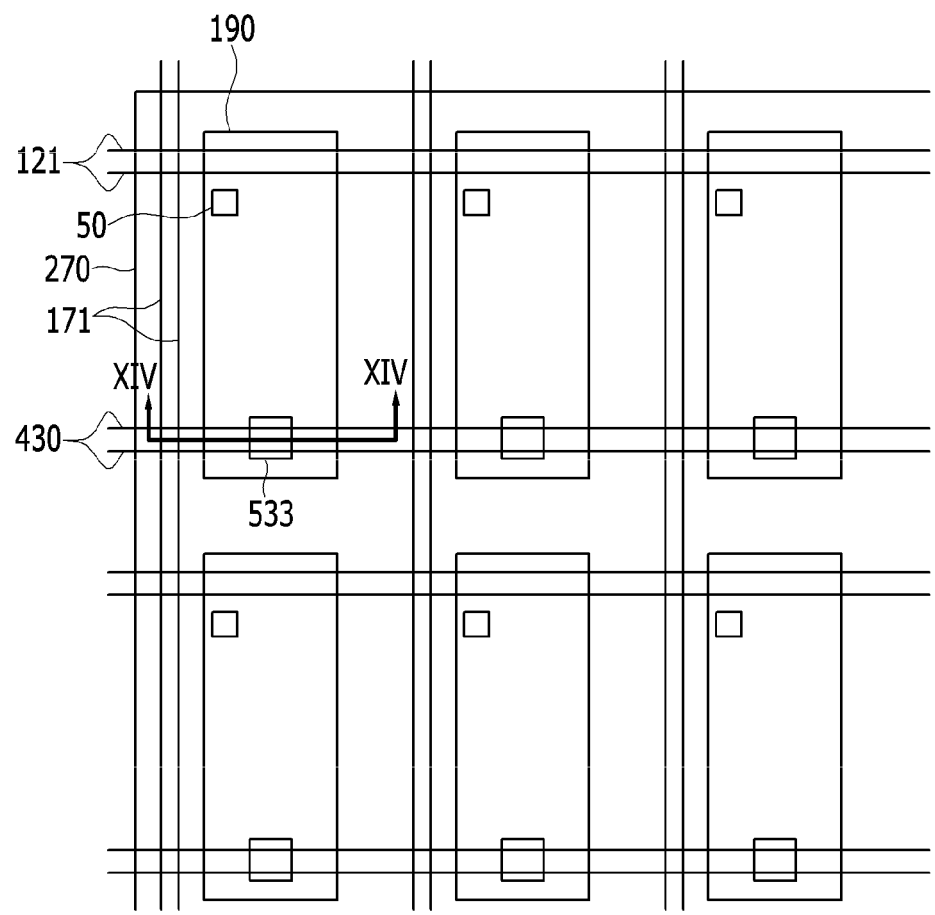
FIG. 13 is a layout view illustrating a haptic display device according to another embodiment.
Figure 14:
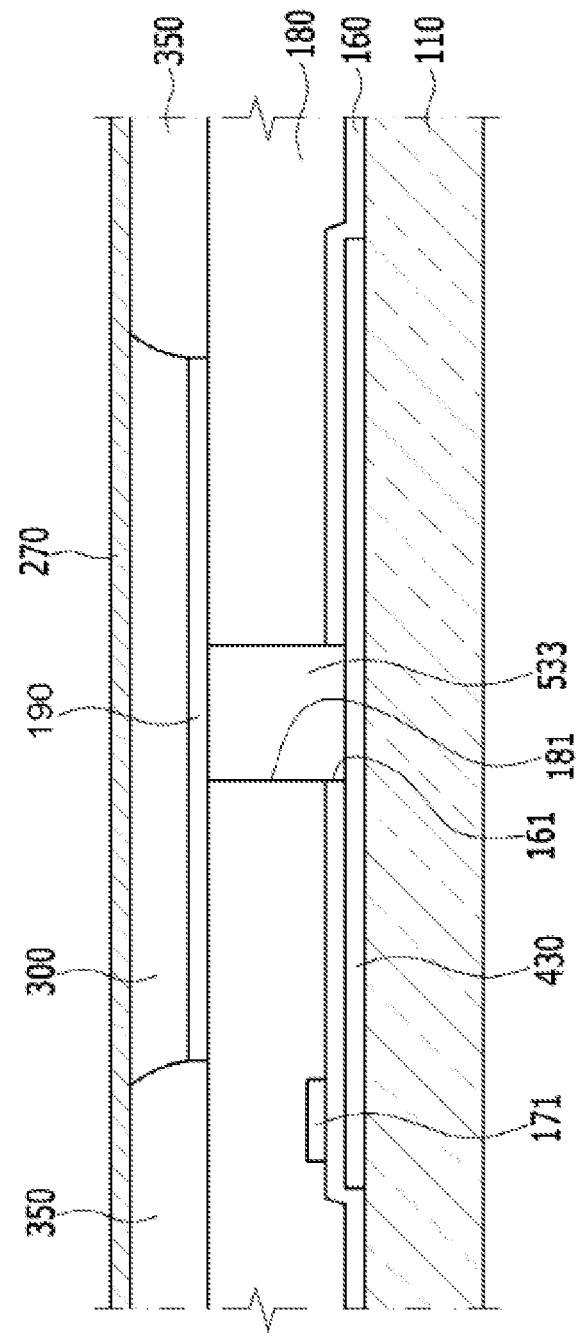
FIG. 14 is a cross-sectional view of the haptic display device taken along line XIV-XIV of FIG. 13.

FIG. 11 is a layout view illustrating a haptic display device according to another embodiment, FIG. 12 is a cross-sectional view of the haptic display device taken along line XII-XII of FIG. 11, FIG. 13 is a layout view illustrating a haptic display device according to another embodiment, and FIG. 14 is a cross-sectional view of the haptic display device taken along line XIV-XIV of FIG. 13.

As shown in FIGS. 11 and 12, the haptic control line 430 is insulated from the data line 171 and is provided on the same layer with the scan line 121 parallel with the scan line 121.

A haptic member 532 is provided between the haptic control line 430 and the second electrode 270. The haptic member 532 is filled in haptic holes 161, 181, and 352, which are formed in an interlayer insulating layer 160, a protective layer 180 and a barrier rib 350 between the haptic control line 430 and the second electrode 270. There can be the same number of the haptic control lines 430 as the scan lines 121 or a smaller number of the haptic control lines 430 than the scan lines 121.

As shown in FIGS. 13 and 14, a haptic member 533 is provided between the haptic control line 430 and the first electrode 190, and the haptic member 533 is filled in haptic holes 161 and 181. The haptic holes 161 and 181 are formed in an interlayer insulating layer 160 and a protective layer 180 between the haptic control line 430 and the first electrode 190, respectively. There can be the same number of the haptic control lines 430 as the scan lines 121 or there can be fewer haptic control lines 430 than the scan lines 121.

Although the haptic control line is on the same layer with the first electrode in one embodiment, the haptic control line can be formed on the same layer with the data line in another embodiment.

Figure 15:
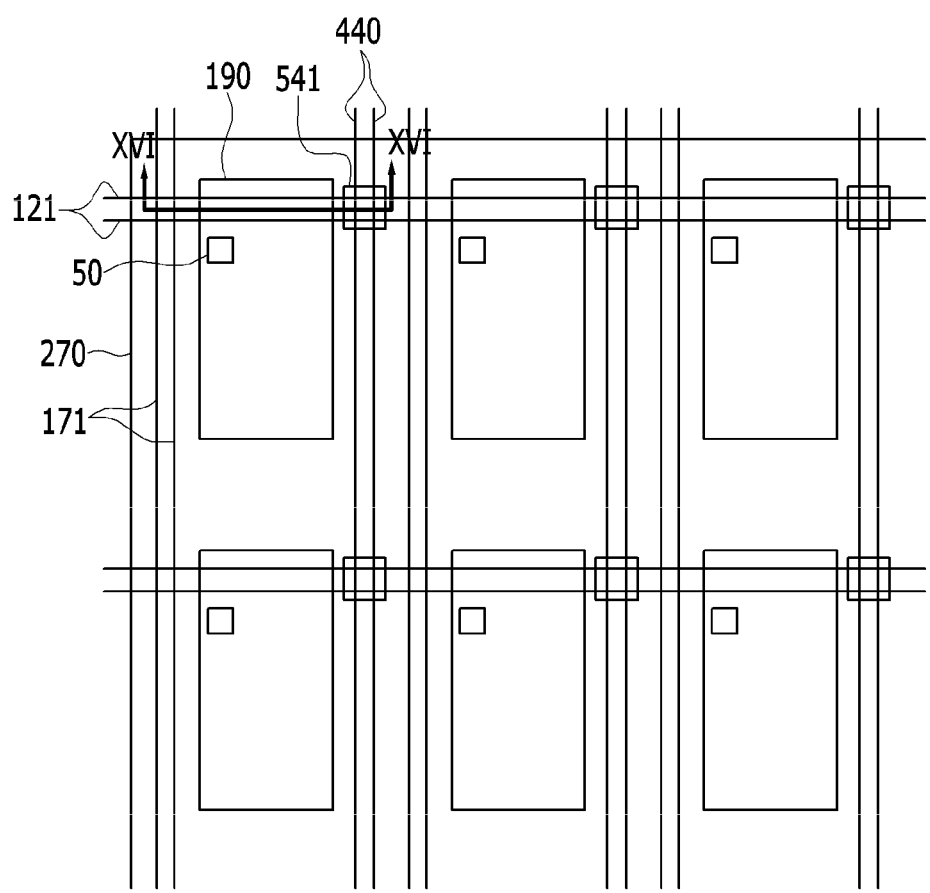
FIG. 15 is a layout view illustrating a haptic display device according to another embodiment.
Figure 16:
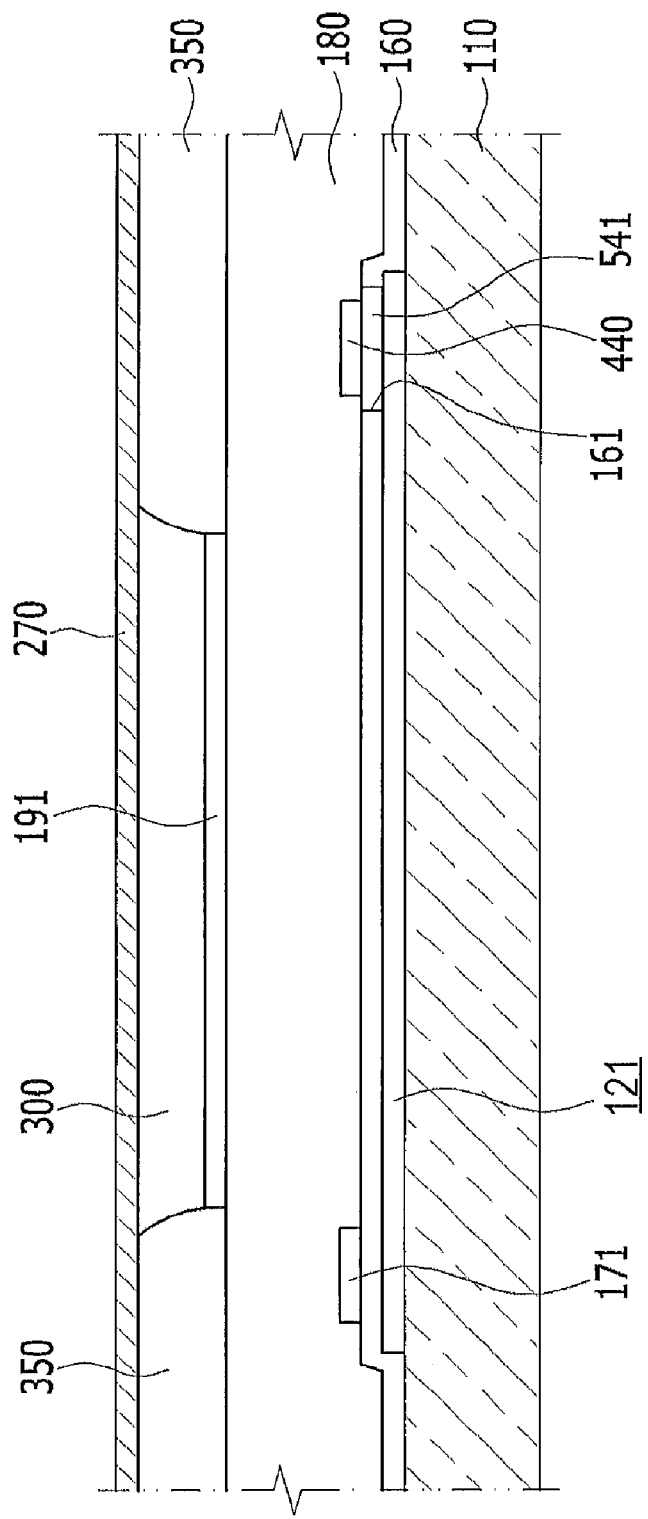
FIG. 16 is a cross-sectional view of the haptic display device taken along line XVI-XVI of FIG. 15.

FIG. 15 is a layout view illustrating a haptic display device according to another embodiment and FIG. 16 is a cross-sectional view of the haptic display device taken along line XVI-XVI of FIG. 15.

As shown in FIGS. 15 and 16, the haptic control line 440 is insulated from the scan line 121 and is on the same layer with the data line 171 close to and parallel with the data line 171.

A haptic member 541 is formed at the crossing region between the scan line 121 in a row direction and the haptic control line 440 in a column direction. The haptic member 541 is formed between the scan line 121 and the haptic control line 440, and the haptic member 541 is filled in a haptic hole 161, which is an interlayer insulating layer 160 between the scan line 121 and the haptic control line 440. There can be the same number of the haptic control lines 440 as the data lines 171 or a smaller number of the haptic control lines 440 than the data lines 171.

The haptic member is between the scan line and the haptic control line in one embodiment. The haptic member can be disposed between the haptic control line and the second electrode in another embodiment. Alternatively, the haptic member can be disposed between the haptic control line and the first electrode in another embodiment.

Figure 17:
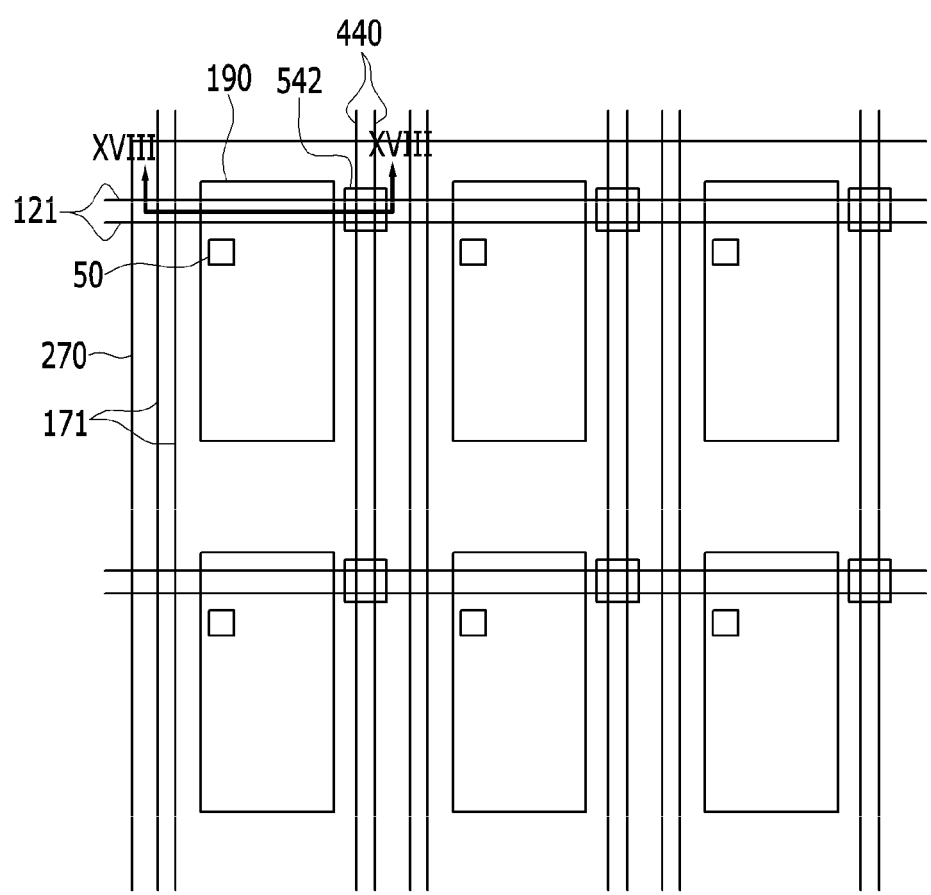
FIG. 17 is a layout view illustrating a haptic display device according another embodiment.
Figure 18:
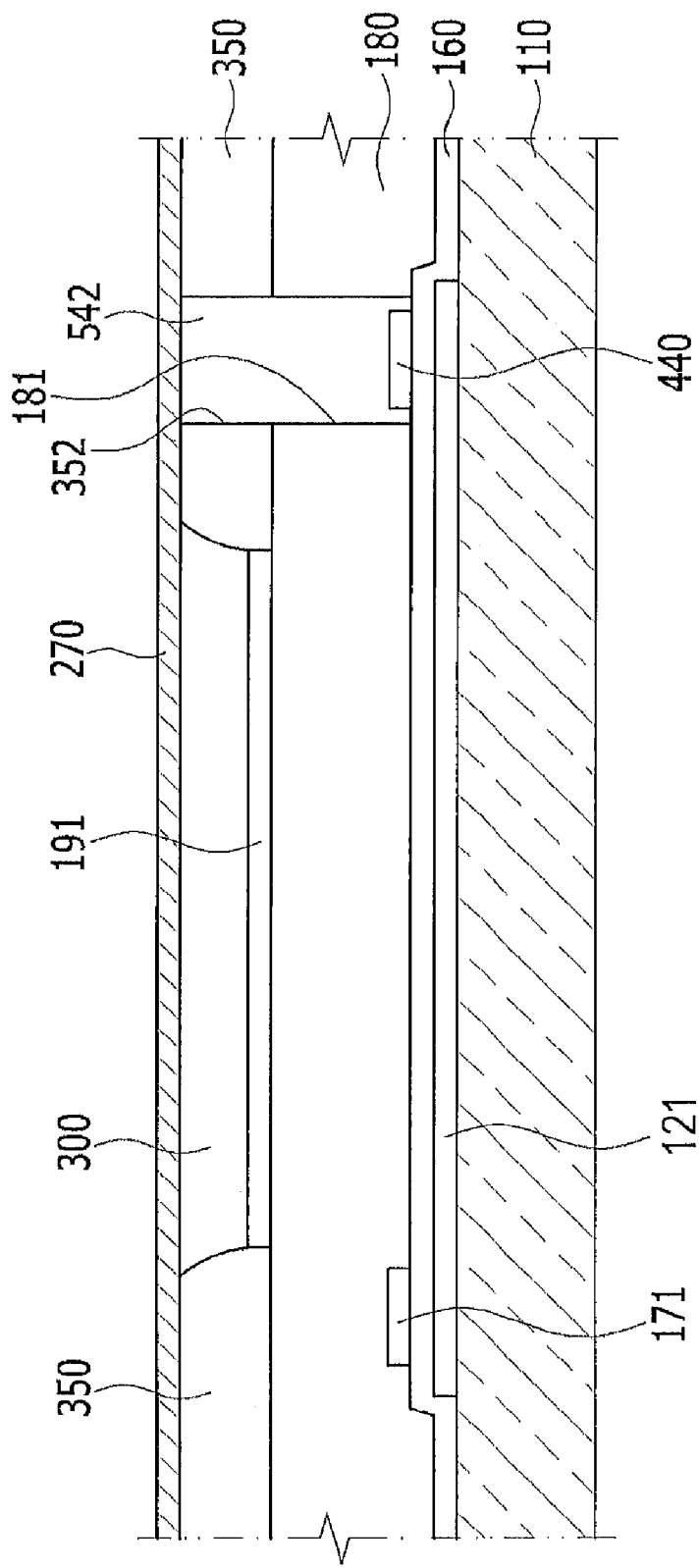
FIG. 18 is a cross-sectional view of the haptic display device taken along line XVIII-XVIII of FIG. 17.

FIG. 17 is a layout view illustrating a haptic display device according another embodiment; FIG. 18 is a cross-sectional view of the haptic display device taken along line XVIII-XVIII of FIG. 17.

Figure 19:
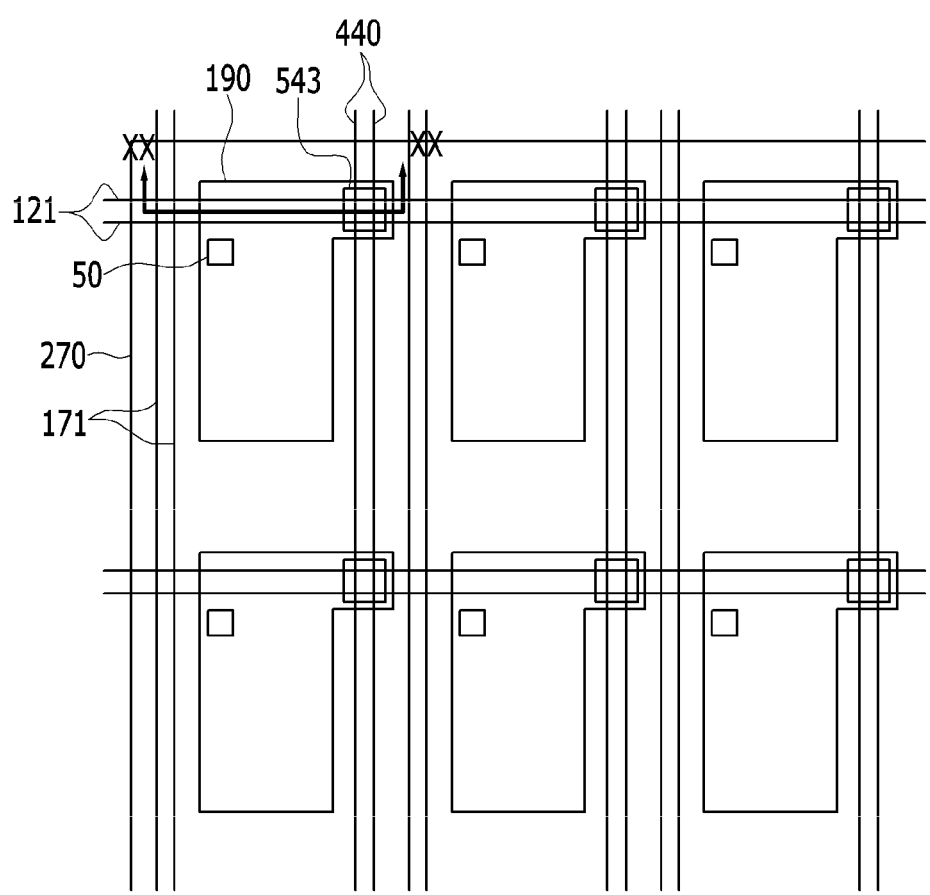
FIG. 19 is a layout view illustrating a haptic display device according to another embodiment.
Figure 20:
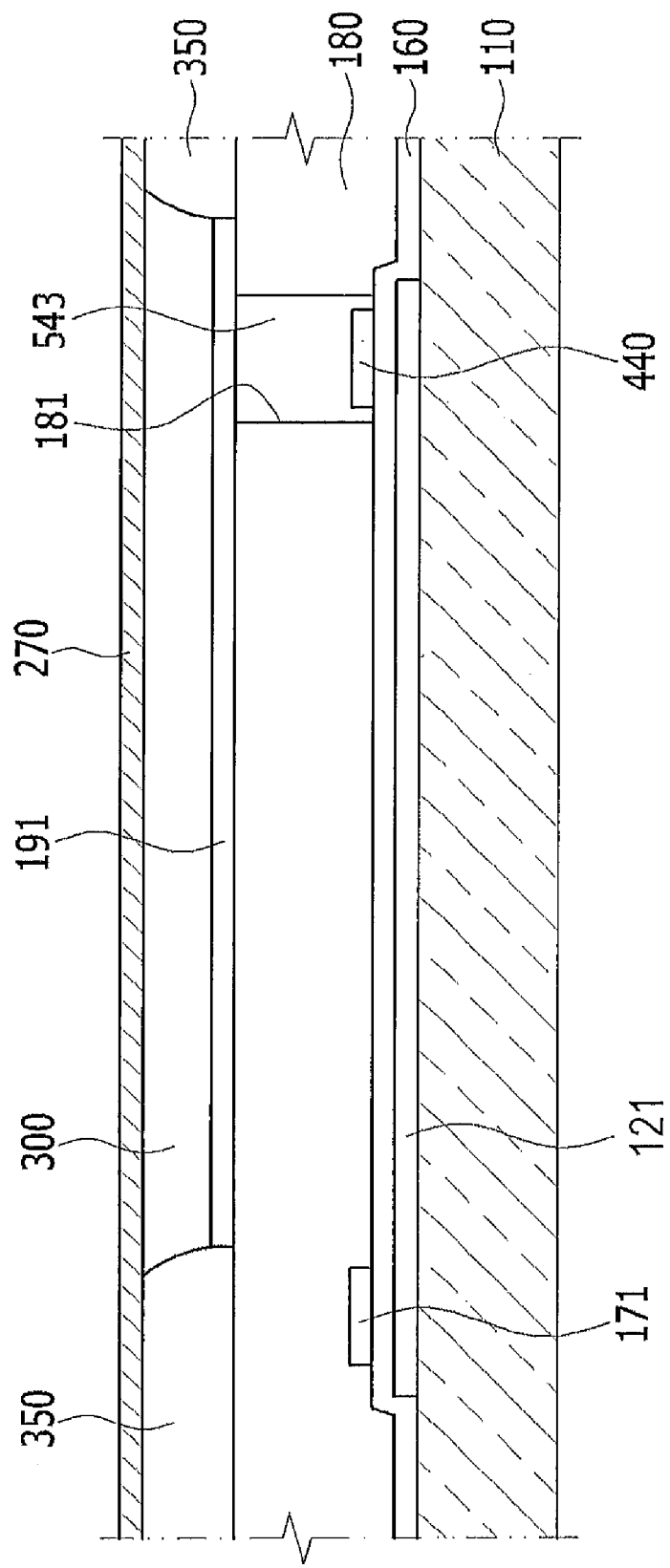
FIG. 20 is a cross-sectional view of the haptic display device taken along line XX-XX of FIG. 19.

FIG. 19 is a layout view illustrating a haptic display device according to another embodiment, and FIG. 20 is a cross-sectional view of the haptic display device taken along line XX-XX of FIG. 19.

As shown in FIGS. 17 and 18, the haptic control line 440 can be insulated from the scan line 121 and is on the same layer with the data line 171 close to and parallel with the data line 171.

The haptic members 542 are provided between the haptic control line 440 and the second electrode 270. The haptic members 542 are filled in haptic holes 181 and 352, which are formed in a protective layer 180 and a barrier rib 350 between the haptic control line 440 and the second electrode 270, respectively. There can be the same number of the haptic control lines 440 as the data lines 171 or a smaller number of the haptic control lines 440 than the data lines 171.

Further, as shown in FIGS. 19 and 20, the haptic member 543 is formed between a haptic control line 440 and the first electrode 190, and the haptic member 543 is filled in a haptic hole 181, which is formed in a protective layer 180 between the haptic control line 440 and the first electrode 190. There can be the same number of the haptic control lines 440 as data lines 171 or a smaller number of the haptic control lines 440 than data lines 171.

Figure 21:
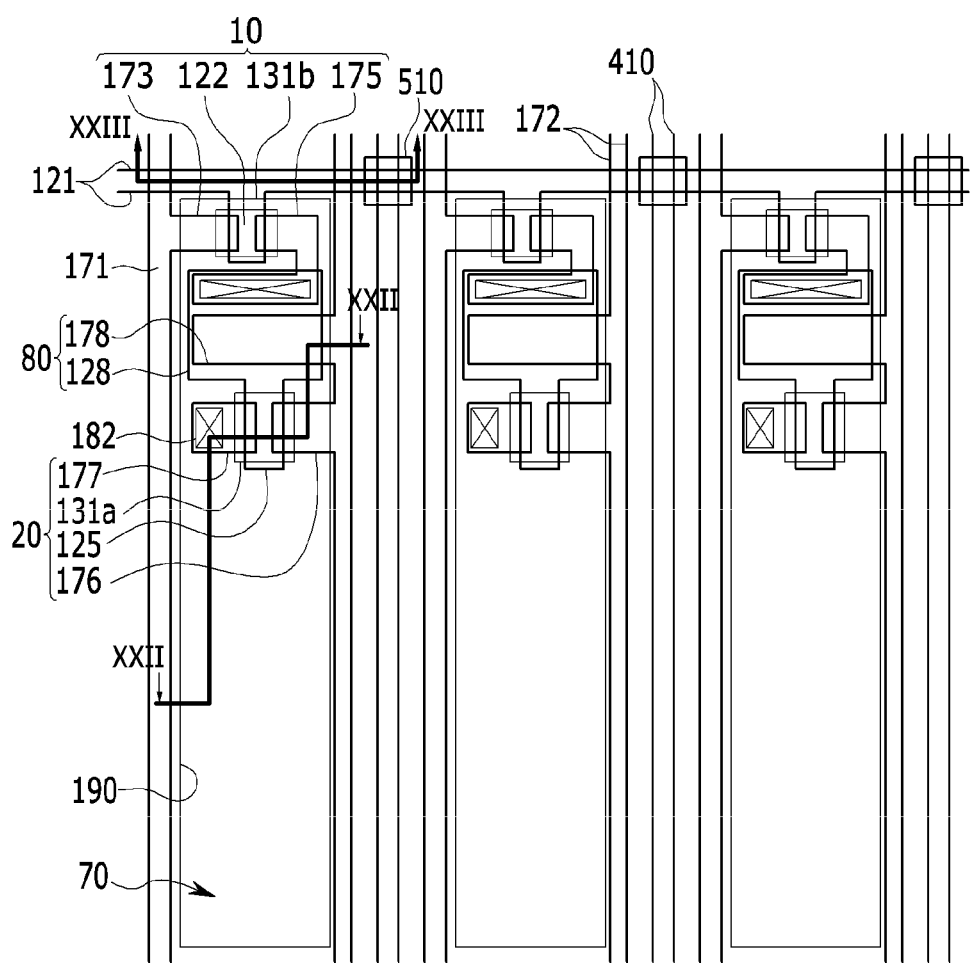
FIG. 21 is a layout view illustrating a haptic display device according to another embodiment.
Figure 22:
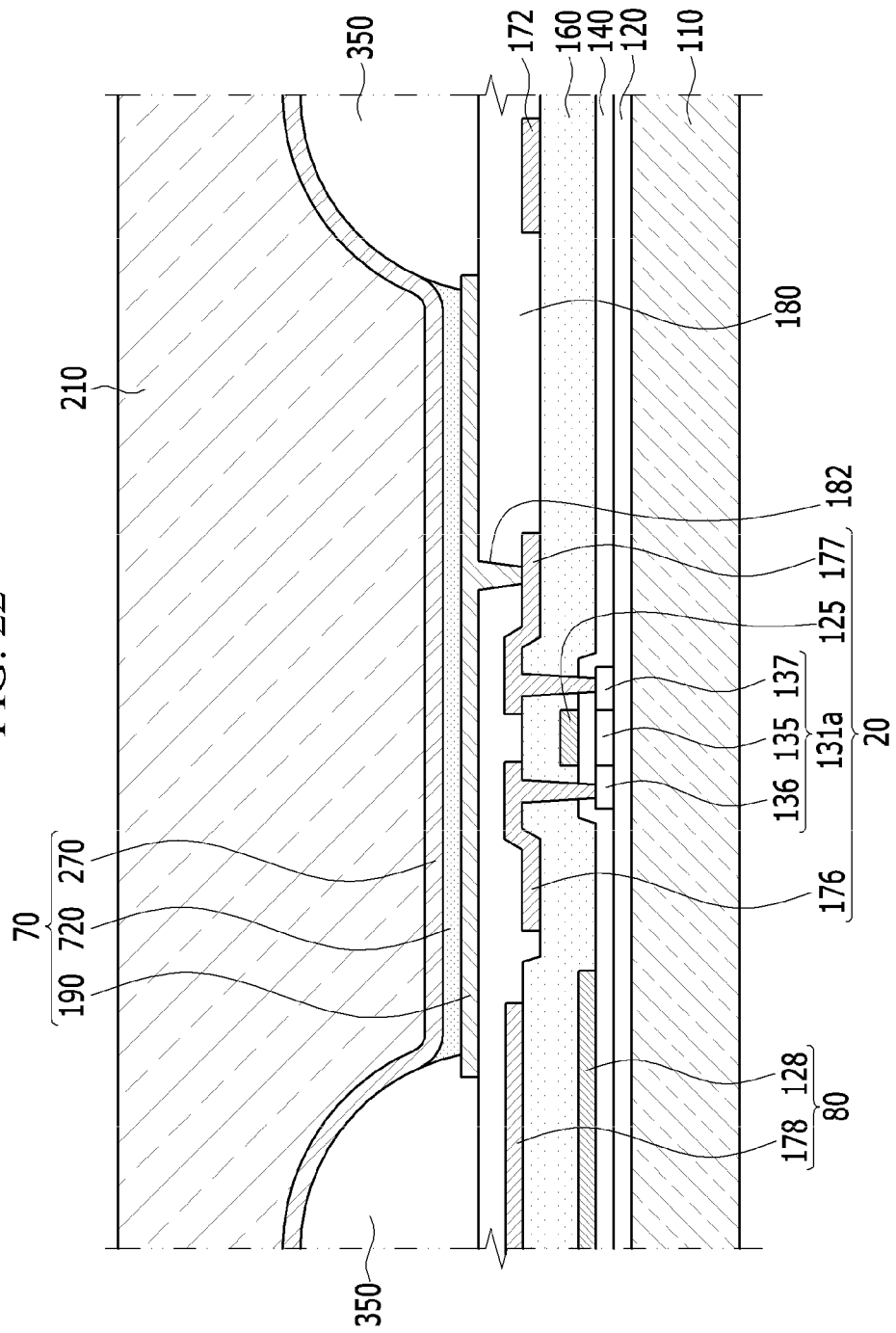
FIG. 22 is a cross-sectional view of the haptic display device taken along line XXII-XXII of FIG. 21.
Figure 23:
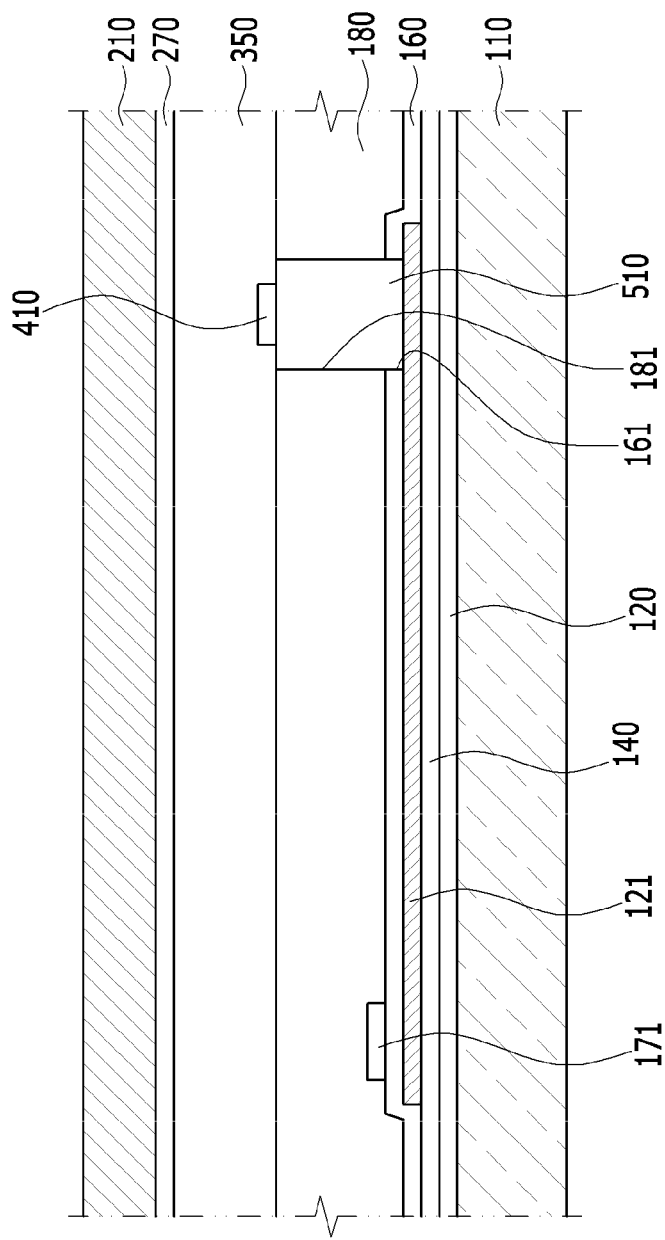
FIG. 23 is a cross-sectional view of the haptic display device taken along line XXIII-XXIII of FIG. 21.

FIG. 21 is a layout view illustrating a haptic display device according to a another embodiment, FIG. 22 is a cross-sectional view of the haptic display device taken along line XXII-XXII of FIG. 21, and FIG. 23 is a cross-sectional view of the haptic display device taken along line XXIII-XXIII of FIG. 21.

As shown in FIGS. 21 to 23, the haptic display device includes a switching thin film transistor 10, a driving thin film transistor 20, a storage device 80, and organic light emitting diode (OLED) 70 that are connected to each pixel. The haptic display device further includes a scan line 121 disposed in a row direction, a data line 171 and a driving voltage line 172 insulated from the scan line 121 while crossing the scan line 121. One pixel can be located between the interposing scan line 121, the data line 171, and the driving voltage, but is not limited thereto.

The organic light emitting diode 70 includes a first electrode 190, an organic emission layer 720 formed on the first electrode 190, and a second electrode 270 formed on the organic emission layer 720. The first electrode 190 is an anode (+) serving as a hole injection electrode, and the second electrode 270 is a cathode (−) serving as an electron injection electrode. That is, the first electrode 190 can be the cathode, and the second electrode 270 can be the anode according to one driving method. In another embodiment, the anode and cathode electrodes can be reversed. Holes and electrons from the first electrode 190 and the second electrode 270 are injected into the organic emission layer 720, respectively. Light emission is achieved when an exciton including injected holes and electrons is changed from an exited state to a ground state.

The organic emission layer 720 is made of a low molecular organic material or a high molecular organic material such as Poly 3,4-ethylenedioxythiophene (PEDOT). Further, the organic emission layer 720 may be formed in a multi-layer including at least one of an emission layer, a hole injection layer (HIL), a hole transport layer (HTL), an electron transport layer (ETL), and an electron injection layer (EIL). When the organic emission layer 720 includes all the above layers, the hole injection layer (HIL) is disposed on the first electrode 190 serving as an anode, and the hole transport layer (HTL), the emission layer, the electron transport layer (ETL), and electron injection layer (EIL) are sequentially laminated on the hole injection layer (HIL).

The organic emission layer 720 may include a red organic emission layer emitting red light, a green organic emission layer emitting green light, and a blue organic emission layer emitting blue light. The red organic emission layer, the green organic emission layer, and the blue organic emission layer are formed in a red pixel, a green pixel, and a blue pixel, respectively, so that a color image is implemented.

In addition, in the organic emission layer 720, the red organic emission layer, the green organic emission layer, and the blue organic emission layer are simultaneously laminated in the red pixel, the green pixel, and the blue pixel, a red filter, a green filter, and a blue filter are provided by pixels to create a color display device. As another example, the white organic emission layers emitting the white light are formed in the red pixel, the green pixel, and the blue pixel, respectively, a red filter, a green filter, and a blue filter are formed in the pixels to make a color display device. When forming the color display using the white organic emission layer and the color filter, a deposition mask is not necessary to be used for deposit the red organic emission layer, the green organic emission layer, and the blue organic emission layer to each individual pixel, that is, the red pixel, the green pixel, and the blue pixel.

The white organic emission layer, illustrated as another example, can be formed in an organic emission layer, and can include a configuration to emit white light by stacking a plurality of organic emission layers. For example, the white organic emission layer includes a configuration to emit white light by a combination of at least one yellow organic emission layer and at least one blue organic emission layer, a configuration to emit white light by a combination of at least one cyan organic emission layer and at least one red organic emission layer, and a configuration to emit white light by a combination of at least one magenta organic emission layer and at least one green organic emission layer.

The storage device 80 includes a first storage plate 128 and a second storage plate 178 disposed while being interposed an interlayer insulating layer 160 therebetween. The interlayer insulating layer 160 becomes a dielectric material. Storage capacitance is determined by an electric charge charged in the storage device 80 and a voltage between both storage plates 128 and 178.

The switching thin film transistor 10 includes a switching semiconductor layer 131b, a switching gate electrode 122, a switching source electrode 173, and a switching drain electrode 175, and a driving thin film transistor 20 includes a driving semiconductor layer 131a, a driving gate electrode 125, a driving source electrode 176, and a driving drain electrode 177.

The switching thin film transistor 10 is used as a switch selecting a pixel emitting light. The switching gate electrode 122 is connected to a scan line 121. The switching source electrode 173 is connected to a data line 171. The switching drain electrode 175 is spaced apart from a switching source electrode 173 and is connected to the first storage plate 128.

The driving thin film transistor 20 applies driving power for emitting an organic emission layer 720 of an OLED 70 in a selected pixel to the first electrode 190. The driving gate electrode 125 is connected to the first storage plate 128. The driving source electrode 176 and the second storage plate 178 are connected to a driving voltage line 172, respectively. The driving drain electrode 177 is connected to the first electrode 190 of the OLED 70 through an electrode contact hole 182.

By this arrangement, the switching thin film transistor 10 operates according to a gate voltage applied to the scan line 121 to transfer a data voltage applied to the data line 171 to the driving thin film transistor 20. A voltage corresponding to a difference between a common voltage applied to the driving thin film transistor 20 from the driving voltage line 172 and a data voltage from the switching thin film transistor 10 is stored in the storage device 80, and a current corresponding to the voltage stored in the storage device 80 flows to the OLED 70 through the driving thin film transistor 20 so that the OLED 70 emits light.

The haptic control line 410 serves to transfer a haptic signal, is insulated from the scan line 121, and is on the same layer with the first electrode 190 parallel with the data line 171.

A haptic member 510 is formed at the crossing region between the scan line 121 in a row direction and the haptic control line 410 in a column direction.

FIGS. 22 and 23 show a structure of a driving thin film transistor. They also show a switching and a driving thin film transistor.

In the haptic display device according to one embodiment, a buffer layer 120 is formed on a substrate 110. The buffer layer 120 functions to prevent infiltration of impurity elements and to planarize a surface of the substrate 110, and may be made of various materials capable of performing the function. For example, the buffer layer 120 may use one of a silicon nitride (SiNx) layer, a silicon oxide (SiO$_2$) layer, or a silicon oxinitride (SiOxNy) layer.

A driving semiconductor layer 131a is formed on a buffer layer 120. The driving semiconductor layer 131a includes a polysilicon layer. Further, the driving semiconductor layer 131a includes a channel region 135, which is not doped with impurities, and a source region 136 and a drain region 137 channel formed aside the channel region 135 which are p+ doped. The impurities are changed according to a type of the thin film transistor.

In one embodiment, a thin film transistor of a PMOS structure where a P type impurity is used in the driving thin film transistor 20. Other embodiments can have other configurations. Accordingly, both of thin film transistors of an NMOS structure or a CMOS structure can be used as the driving thin film transistor 20.

Further, although the driving thin film transistor 20 shown in FIG. 22 is a multi-layered thin film transistor including a multi-polysilicon layer, a switching thin film transistor 10 not shown in FIG. 22 can include a multi-layered thin film transistor or an amorphous thin film transistor with an amorphous silicon layer.

A gate insulating layer 140 made of silicon nitride (SiNx) or silicon oxide (SiO$_2$) is formed on the driving semiconductor layer 131a. A gate wire including a gate electrode 125 is provided on a driving gate insulating layer 140. Further, the gate wire further includes a scan line 121, a first storage plate 128, and other wires. Moreover, the driving gate electrode 125 overlaps with at least a part of the driving semiconductor layer 131a, particularly, with a channel region 135.

An interlayer insulating layer 160 covering the gate electrode 125 is formed on the gate insulating layer 140. The gate insulating layer 140 and the interlayer insulating layer 160 include through-holes exposing a source region 136 and a drain region 137 of the semiconductor layer 131a in common. The interlayer insulating layer 160 is made of a ceramic-based material such as silicon nitride (SiNx) or silicon oxide (SiO$_2$) as in the gate insulating layer 140.

A data wire including a driving source electrode 176 and a driving drain electrode 177 is on the interlayer insulating layer 160. Moreover, the data wire further includes a data line 171, a driving voltage line 172, a second storage plate 178, and other wires. In addition, the driving source electrode 176 and the driving drain electrode 177 are connected to a source region 136 and a drain region 137 of the semiconductor layer 131a through through-holes, which are formed in the interlayer insulating layer 160 and the gate insulating layer 140, respectively.

In this manner, a driving thin film transistor 20 including the driving semiconductor layer 131a, the driving gate electrode 125, the driving source electrode 176, and the driving drain electrode 177 is prepared. A configuration of the driving thin film transistor 20 is not limited to the above examples, but may be modified to a known configuration in various different ways so that those skilled in the art to which the invention pertains can easily realize.

A protective layer 180 covering data wires 172, 176, 177, and 178 is formed on the interlayer insulating layer 160. The protective layer 180 serves to remove step difference and to planarize an OLED 70 to be on the protective layer 180 in order to improve luminous efficiency of the OLED 70. Further, the protective layer 180 includes a contact hole 182 exposing a part of the drain electrode 177.

The protective layer 180 may be made of one material of acryl-based resin (polyacrylates resin), epoxy resin, phenolic resin), polyamides resin, polyimides rein, unsaturated polyesters resin, poly phenylenethers resin, poly phenylenesulfides resin, and benzocyclobutene (BCB).

In addition, the exemplary embodiment according to the present invention is not limited to the foregoing structure, but one of the protective layer 180 and the interlayer insulating layer 160 may be omitted.

The haptic members 510 are disposed between the scan line 121 and the haptic control line 410, and the haptic members 510 are filled in haptic holes 161 and 181 which are formed in the interlayer insulating layer 160 and the protective layer 180 between the scan line 121 and the haptic control line 410, respectively. Since there is the same number of haptic control lines 410 as the data lines 171, the same number of haptic members 510 can be formed as pixels.

When there is a difference in potential between the scan line 121 at a lower portion of the haptic member 510 and the haptic control line 410 at an upper portion of the haptic member 510, the height of the haptic member 510 is changed by Coulomb force. This is due to polarization of EAP constituting the haptic member 510, and haptic vibration is generated using the change in the height of the haptic member 510.

In this manner, the haptic control line 410 and the haptic member 510 are formed inside the display device. Accordingly, since a separate haptic actuator is not required, the haptic display device may be miniaturized and slimmed, and can be used in a flexible display device.

In addition, there can be the same number of haptic members 510 as pixels.

A first electrode 190 of the organic light emitting diode OLED 70 is formed on the protective layer 180. A plurality of the first electrode 190 are provided for every pixel. In this case, the plurality of the first electrode 190 are spaced apart from each other. The first electrode 190 is connected to a drain electrode 177 through a contact hole 182 of the protective layer 180.

Further, a barrier rib 350 having an opening exposing the first electrode 190 is formed on the protective layer 180. That is, the barrier rib 350 includes a plurality of openings formed for each pixel. In addition, the first electrode 190 is disposed corresponding to an opening of the barrier rib 350. However, the first electrode 190 is not always at an opening of the barrier rib 350, but may be disposed below the barrier rib 350 so that the first electrode 190 partially overlaps with the barrier rib 350. The barrier rib 350 may be made of polyacryl-based resin (polyacrylates resin) and polyimide-based resin or a silica-based-inorganic material.

The organic emission layer 720 is formed on the first electrode 190, and the second electrode 270 is provided on the organic emission layer 720. In this manner, the organic light emitting diode OLED 70 including the first electrode 190, the organic emission layer 720, and the second electrode 270 is prepared.

The organic emission layer 720 is made of a low molecular organic material or a polymeric organic material. Further, the organic emission layer 720 may be formed in a multilayer including at least one of an emission layer, a hole injection layer (HIL), a hole transport layer (HTL), an electron transport layer (ETL), and an electron injection layer (EIL). When the organic emission layer 720 includes all the above layers, the hole injection layer (HIL) is disposed on the first electrode 190 serving as an anode, and the hole transport layer (HTL), the emission layer, the electron transport layer (ETL), and electron injection layer (EIL) are sequentially laminated on the hole injection layer (HIL).

In addition, the organic emission layer 720 is disposed in only the opening of the barrier rib 350 in FIG. 22. Accordingly, the organic emission layer 720 may be formed not only on the first electrode 190, but also between the barrier rib 350 and the second electrode 270, in the opening of the barrier rib 350. In detail, the organic emission layer 720 may further include a plurality of layers such as the hole injection layer (HIL), the hole transport layer (HTL), the electron transport layer (ETL), and the electron injection layer (EIL) together with the emission layer. In this case, the hole injection layer (HIL), the hole transport layer (HTL), the electron transport layer (ETL), and the electron injection layer (EIL) except for the emission layer may be formed on the barrier rib 350 as well as the first electrode 190 like the second electrode 270 using an open mask during a manufacturing procedure. That is, at least one of the plurality of layers included in the organic emission layer 720 may be disposed between the barrier rib 350 and the second electrode 270.

The first electrode 190 and the second electrode 270 can be made of a transparent conductive material, a transflective or reflective conductive material. The OLED 70 may be a top-emitting OLED, a bottom-emitting OLED or a double side-emitting OLED according to types of materials forming the first electrode 190 and the second electrode 270.

A transparent conductive material may use a material such as Indium Tin Oxide (ITO), Indium Zinc Oxide (IZO), zinc oxide (ZnO) or Indium Oxide ($In_2O_3$). A reflective material and a transflective material may use a material such as lithium (Li), calcium (Ca), lithium fluoride/calcium (LiF/Ca), lithium fluoride/aluminum (LiF/Al), aluminum (Al), silver (Ag), magnesium (Mg), or gold (Au).

A sealing member 210 is arranged on the second electrode 270 opposite to a display substrate 110. The sealing member 210 may be made of a transparent material such as glass and a plastic material, or may be formed in a thin film encapsulation layer including a plurality of thin films. The thin film encapsulation layer may be formed by alternately stacking at least one organic layer and at least one inorganic layer.

The organic layer is made of a polymer. It is preferable that the organic layer may be a single layer or a laminated layer that is made of one of polyethyleneterephthalate, polyimide, polycarbonate, epoxy, polyethylene and polyacrylate. It is more preferably that the organic layer may be made of polyacrylate. In detail, the polyacrylate includes a polymerized monomer composition having diacrylate based-monomer and a triacrylate based-monomer. The monomer composition may further include a monoacrylate-based monomer. In addition, the monomer composition may further include a known photoinitiator such as TPO, but is not limited thereto.

The inorganic layer may be a single layer or a laminated layer including metal oxide or metal nitride. In detail, the inorganic layer may include one of SiNx, $Al_2O_3$, $SiO_2$, and $TiO_2$. An externally exposed top layer among the thin film encapsulation layers may include an inorganic layer to prevent permeation with respect to the OLED.

Further, the thin film encapsulation layer may include at least one sandwich structure where at least one organic layer is sandwiched between at least two inorganic layers. Moreover, the thin film encapsulation layer may include at least one sandwich structure where at least one inorganic layer is sandwiched between at least two organic layers.

In addition, the thin film encapsulation layer may include a first inorganic layer, a first organic layer, and a second inorganic layer, which are sequentially formed from the OLED. Furthermore, the thin film encapsulation layer may include the first inorganic layer, the first organic layer, the second inorganic layer, a second organic layer, and a third inorganic layer which are sequentially formed from the OLED. The thin film encapsulation layer may include the first inorganic layer, the first organic layer, the second inorganic layer, the second organic layer, the third inorganic layer, a third organic layer, and a fourth inorganic layer which are sequentially formed from the OLED.

A metal halide layer including LiF can be formed in between the OLED and the first inorganic layer. When the first inorganic layer is formed through a sputtering scheme or a plasma deposition scheme, the metal halide layer can prevent the OLED from being damaged.

An area of the first organic layer can be smaller than that of the second inorganic layer, and an area of the second organic layer can be smaller than that of the third inorganic layer. Further, the first organic layer may be perfectly covered with the second inorganic layer, and the second organic layer may be perfectly covered with the third inorganic layer.

Although one embodiment of the display device has a 2Tr 1cap structure, another embodiment of the display device has a 6Tr 2cap structure.

Figure 24:
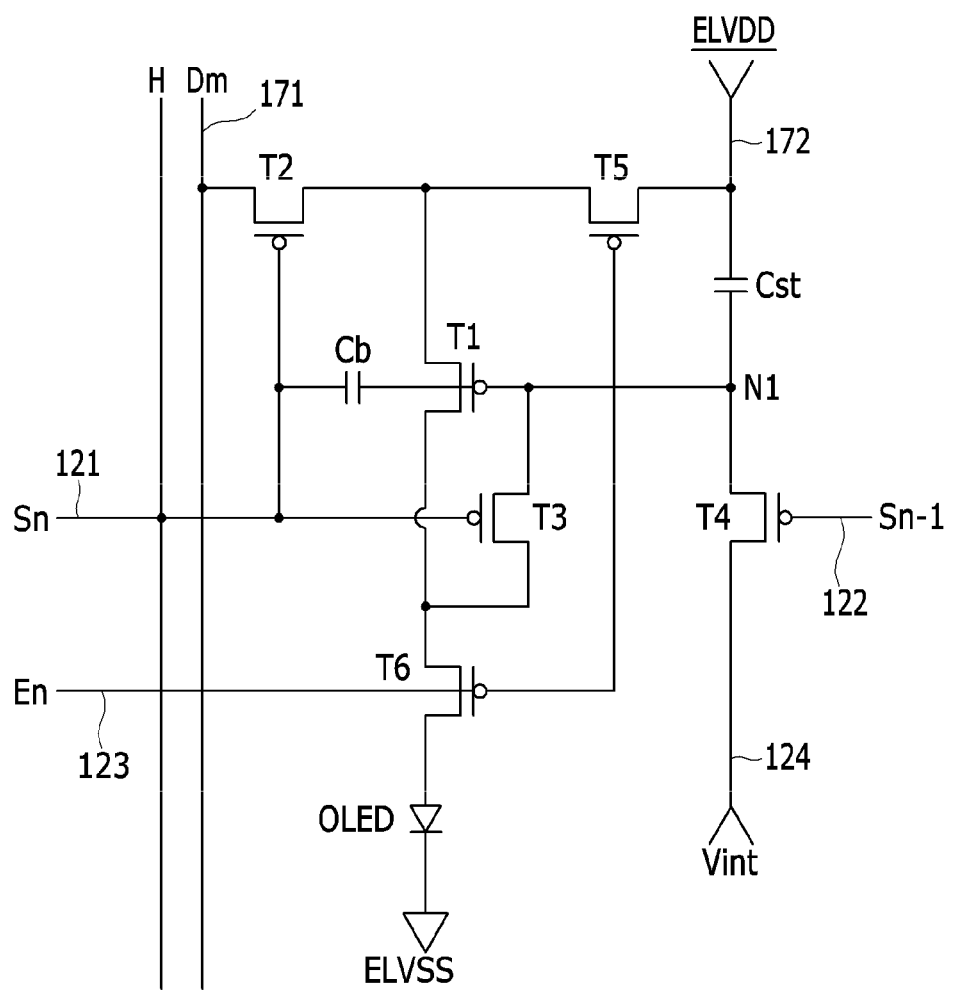
FIG. 24 is an equivalent circuit diagram illustrating one pixel of the haptic display device according to another embodiment.

FIG. 24 is an equivalent circuit diagram illustrating one pixel of the haptic display device according to another embodiment.

As shown in FIG. 24, one pixel of a haptic display device includes a plurality of signal lines 121, 122, 123, 124, 171, and 172, a plurality of thin film transistor T1, T2, T3, T4, T5, and T6 connected to the signal lines 121, 122, 123, 124, 171, and 172, capacitors Cst and Cb, and an organic light emitting diode (OLED).

Thin film transistor includes a driving thin film transistor T1, a switching thin film transistor T2, a compensation thin film transistor T3, an initialization thin film transistor T4, a first light emission control thin film transistor T5, and a second light emission control thin film transistor T6. The capacitors Cst and Cb a storage capacitor Cst and a boosting capacitor Cb.

A signal line includes a scan line 121 transferring a signal Sn, a previous scan line 122 transferring a previous scan signal Sn−1 to the initialization thin film transistor T4, a light emission control line 123 transferring a light emission control signal En to the first light emission control thin film transistor T5 and the second light emission control thin film transistor T6, a data line 171 crossing the scan line 121 and transferring a data signal Dm, a driving voltage line 172 transferring a driving voltage ELVDD and being substantially parallel with the data line 171, and a voltage line 124 transferring an initialization voltage Vint for initializing the driving thin film transistor T1.

A gate electrode of the switching thin film transistor T2 is connected to the scan line 121, a source electrode of the switching thin film transistor T2 is connected to the data line 171, a drain electrode of the switching thin film transistor T2 is electrically connected to a source electrode of the driving thin film transistor T1 and the driving voltage line 172. The switching thin film transistor T2 performs a switching operation according to the scan signal received through the scan line 121.

The driving thin film transistor T1 receives the data signal according to the switching operation of the switching thin film transistor T2 to supply a driving current to the organic light emitting diode OLED.

A gate electrode of the thin film transistor T1 is connected one terminal of the storage capacitor Cst, and another terminal of the storage capacitor Cst is connected to the driving voltage line 172. Further, the scan line 121 connected to the gate electrode of the switching thin film transistor T2 is connected to one terminal of the boosting capacitor Cb, and another terminal of the boosting capacitor Cb is connected to the gate electrode of the driving thin film transistor T1.

A drain electrode of the driving thin film transistor T1 is electrically connected to an anode of the organic light emitting diode OLED. Moreover, a cathode of the organic light emitting diode OLED is connected to a common voltage ELVSS. Accordingly, the organic light emitting diode OLED receives the driving current from the driving thin film transistor T1 to emit light so that an image is displayed.

Hereinafter, a structure of one pixel of the haptic display device shown in FIG. 24 will be described in detail with reference to FIGS. 25 to 28 in cooperation with FIG. 24.

Figure 25:
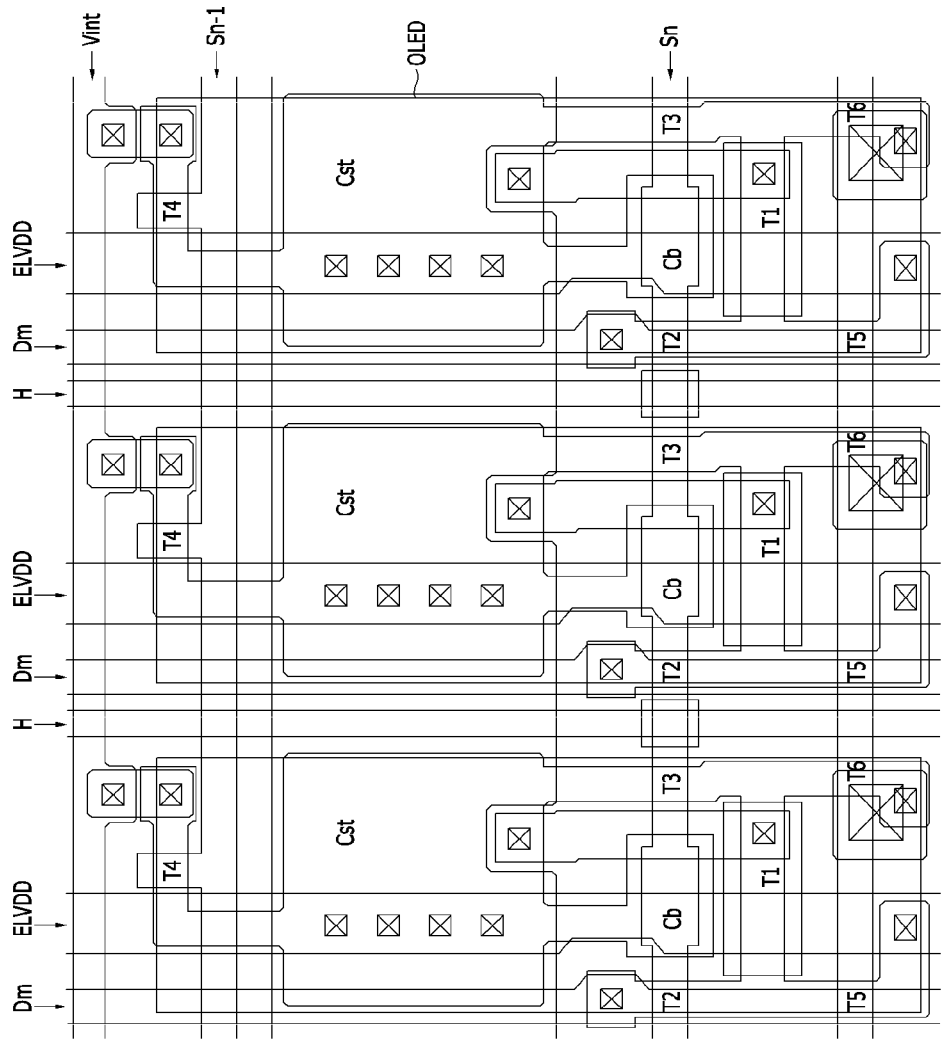
FIG. 25 is a schematic view illustrating position of a plurality of thin film transistors and a capacitor in one pixel of a haptic display device according to the embodiment of FIG. 24.
Figure 26:
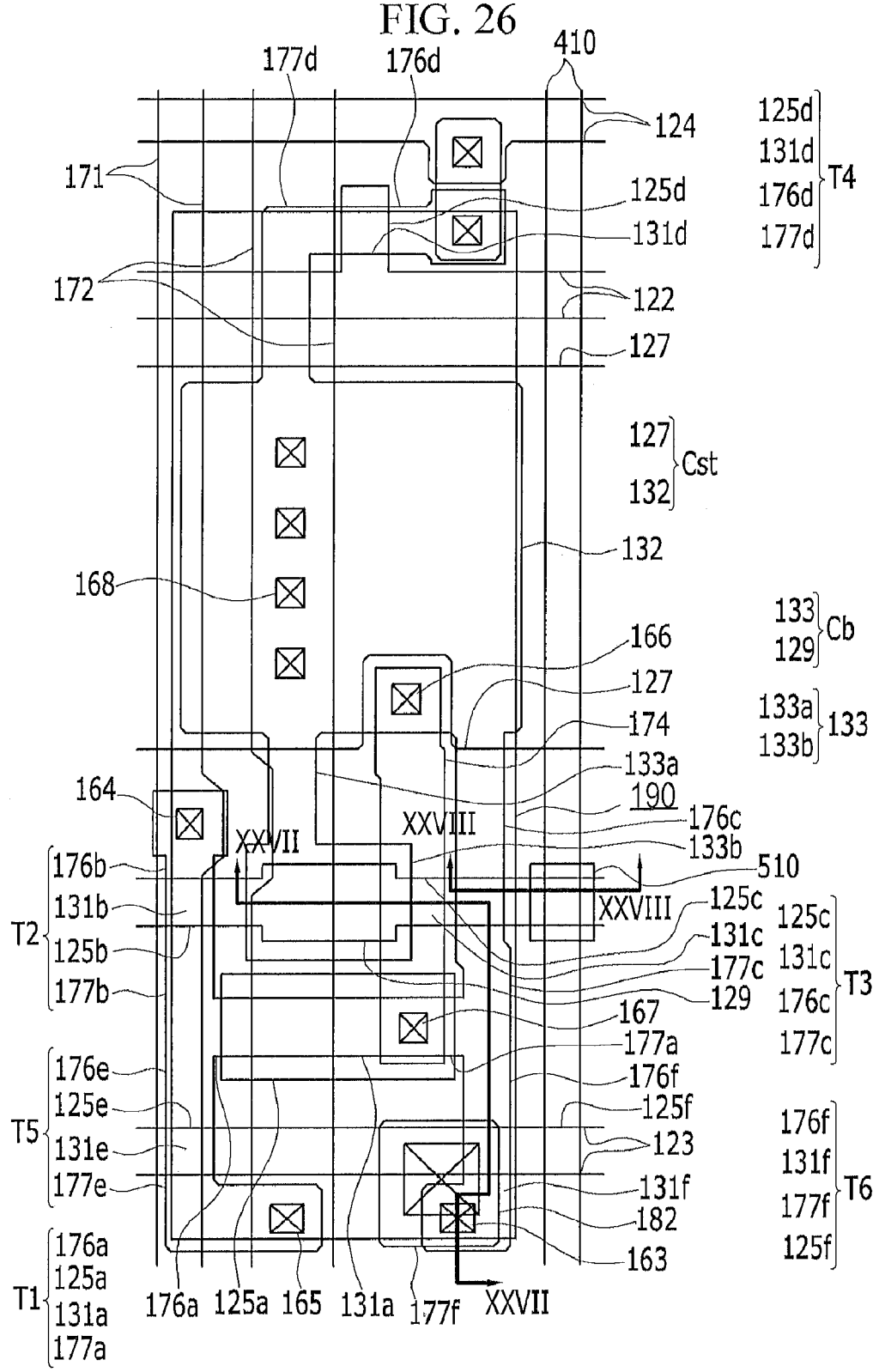
FIG. 26 is a layout view illustrating a haptic display device according to embodiment of FIG. 24.
Figure 27:
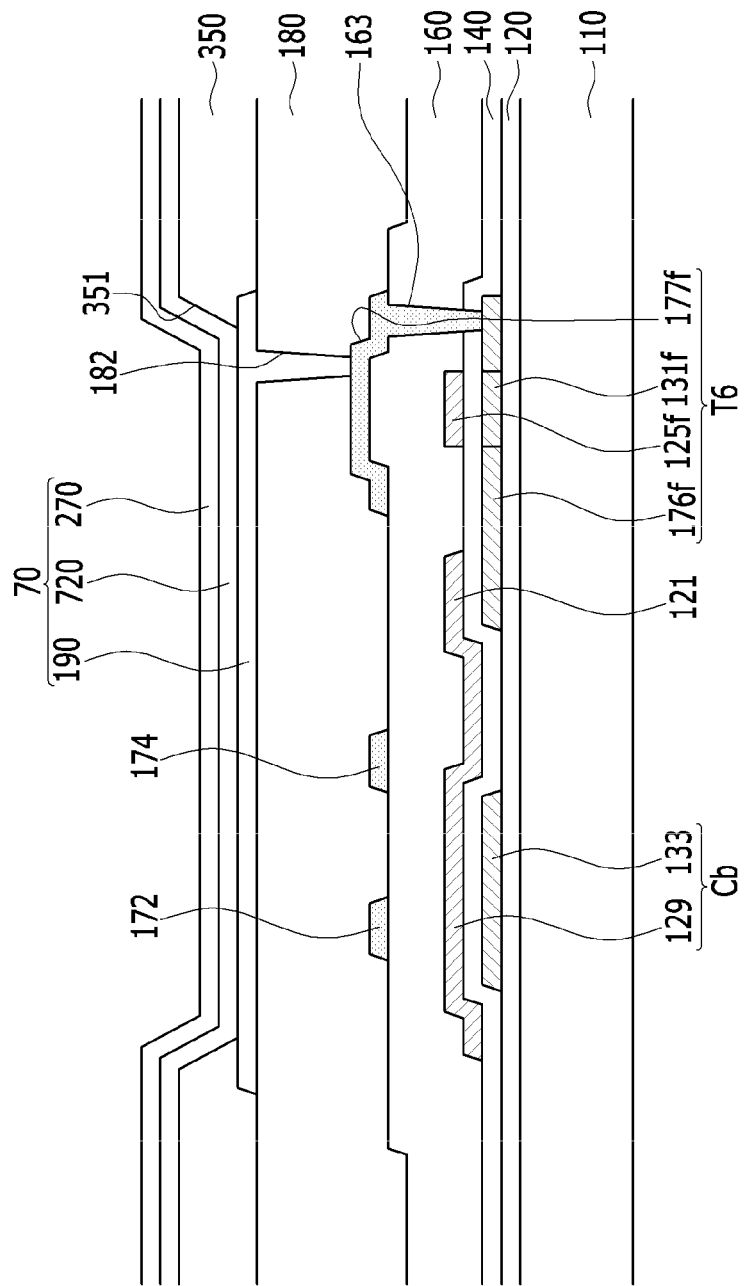
FIG. 27 is a cross-sectional view of the haptic display device taken along line XXVII-XXVII of FIG. 26.
Figure 28:
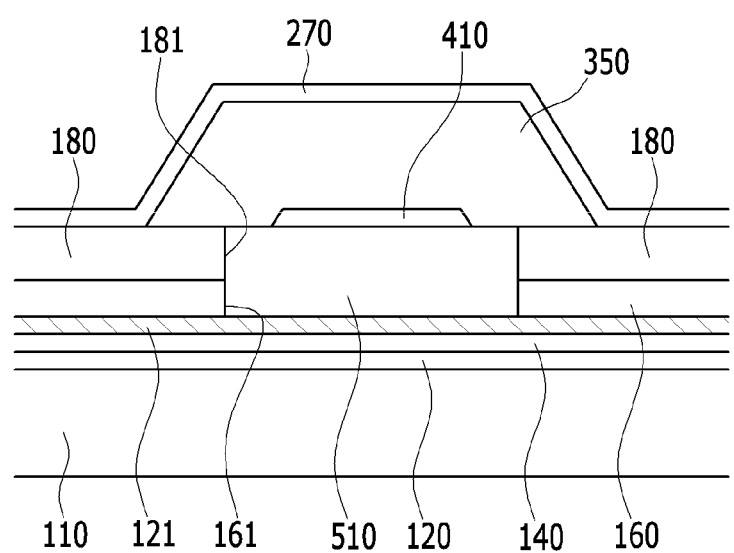
FIG. 28 is a cross-sectional view of the haptic display device taken along line XXVIII-XXVIII of FIG. 26.

FIG. 25 is a schematic view illustration positions of a plurality of thin film transistors and a capacitor in one pixel of a haptic display device according to one embodiment, FIG. 26 is a layout view illustrating a haptic display device of FIG. 25, FIG. 27 is a cross-sectional view of the haptic display device taken along line XXVII-XXVII of FIG. 26, and FIG. 28 is a cross-sectional view of the haptic display device taken along line XXVIII-XXVIII of FIG. 26.

As shown in FIGS. 25 to 28, a pixel of the haptic display device includes a scan line 121, a previous scan line 122, a light emission control line 123, and an initialization voltage line 124 applying a scan signal Sn, a previous signal Sn−1, a light emission control signal En and an initialization voltage Vint, respectively, and being formed in a row direction, a data line 171 and a driving voltage line 172 crossing the scan line 121, the previous scan line 122, the light emission control line 123 and the initialization voltage line 124 and applying a data signal Dm and a driving voltage ELVDD to the pixel, respectively. Further, the pixel of the haptic display includes a previous scan line 122, a light emission control line 123, and an initialization voltage line 124, and a haptic control line 410 crossing the scan line 121, the previous scan line 122, the light emission control line 123, and the initialization voltage line 124 and transferring a haptic signal H to the pixel.

In addition, the pixel includes a driving thin film transistor T1, a switching thin film transistor T2, a compensation thin film transistor T3, an initialization thin film transistor T4, a first light emission control thin film transistor T5, a second light emission control thin film transistor T6, a storage capacitor Cst, a boosting capacitor Cb, and an organic light emitting diode (OLED) 70.

The driving thin film transistor T1 includes a driving semiconductor layer 131a, a driving gate electrode 125a, a driving source electrode 176a, and a diving drain electrode 177a. The driving source electrode 176a corresponding to a driving source region of the driving semiconductor layer 131a, and the driving drain electrode 177a corresponds to a driving drain region of the driving semiconductor layer 131a.

The switching thin film transistor T2 includes a switching semiconductor layer 131b, a switching gate electrode 125b, a switching source electrode 176b, and a switching drain electrode 177b.

The compensation thin film transistor T3 includes a compensation semiconductor layer 131c, a compensation gate electrode 125c, a compensation source electrode 176c, and a compensation drain electrode 177c. The thin film transistor T4 includes an initialization semiconductor layer 131d, an initialization gate electrode 125d, an initialization source electrode 176d, and an initialization drain electrode 177d.

The first light emission control thin film transistor T5 includes a first light emission control semiconductor layer 131e, a first light emission control gate electrode 125e, a first light emission control source electrode 176e, and a first light emission control drain electrode 177e. The second light emission control thin film transistor T6 includes a second light emission control semiconductor layer 131f, a second light emission control gate electrode 125f, a second light emission control source electrode 176f and a second light emission control drain electrode 177f.

The storage capacitor Cst includes a first storage plate 132 and a second storage plate 127 disposed while being interposed a gate insulating layer 140 therebetween. The gate insulating layer 140 becomes a dielectric material. Storage capacitance is determined by an electric charge charged in the capacitor Cst and a voltage between both storage plates 132 and 127.

The first storage plate 132 is formed on the same layer with the driving semiconductor layer 131a, the switching semiconductor layer 131b, the compensation semiconductor layer 131c, the first light emission control semiconductor layer 131e, and the second light emission control semiconductor layer 131f. The second storage plate 127 is on the same layer with the scan line 121 and the previous scan line 122.

The driving semiconductor layer 131a of the driving thin film transistor T1 connects the switching semiconductor layer 131b and the compensation semiconductor layer 131c to the first light emission control semiconductor layer 131e and the second light emission control semiconductor layer 131f.

Accordingly, the driving source electrode 176a is connected to the switching drain electrode 177b and the first light emission control drain electrode 177e, and the drain electrode 177a is connected to the compensation drain electrode 177c and the second light emission control source electrode 176f.

The first storage plate 132 of the storage capacitor Cst is connected to the compensation source electrode 176c and the initialization drain electrode 177d, and is connected to a driving gate electrode 125a through a connection member 174. In this case, the connection member 174 is formed on the same layer with the data line 171. The connection member 174 is connected to the first storage plate 132 through a contact hole 166, which is formed in the interlayer insulating layer 160 and the gate insulating layer 140, and is connected to the driving gate electrode 125a through the contact hole 167, which is formed in the interlayer insulating layer 160.

The second storage plate 129 of the storage capacitor Cst is connected to the driving voltage line 172 and is formed approximately parallel with the scan line 121.

The first boosting storage plate 133 of the boosting capacitor Cb is an extension portion which extends from the first storage plate 132, and the second boosting storage plate 129 is a protruding portion which protrudes upward and downward of the scan line 121.

The first boosting storage plate 133 has a hammer shape, and the first boosting storage plate 133 includes a handle portion 133a parallel with the driving voltage line 172 and a head portion 133b formed at an end of the handle portion 133a.

The protruding portion of the second boosting storage plate 129 overlaps an inside of the head portion 133b of the first boosting storage plate 133. Accordingly, an area of the first boosting storage plate 133 of the boosting capacitor Cb is larger than an area of the second boosting storage plate 129.

Meanwhile, the switching thin film transistor T2 is used as a switch selecting a pixel emitting light. The switching gate electrode 125b is connected to the scan line 121. The switching source electrode 176b is connected to the data line 171. The switching drain electrode 177b is connected to the driving thin film transistor T1 and the first light emission control thin film transistor T5.

A second light emission control drain electrode 177f of the second light emission control thin film transistor T6 is directly connected to a pixel electrode 190 of the organic light emitting diode (OLED) 70 through a contact hole 182 of the protective layer 180.

In this case, a structure of the thin film transistor will be described based on the second light emission control thin film transistor T6. Further, remaining thin film transistors T1, T2, T3, T4, and T5 is almost the same as a stack structure of the second light emission control thin film transistor T6 and thus the detailed description thereof is omitted.

A buffer layer 120 is formed on the substrate 110, and the second light emission control semiconductor layer 131f and the first boosting storage plate 133 constituting a boosting capacitor Cb are formed on the buffer layer 120. The substrate 110 may include an insulation substrate made of glass, quartz, a ceramic material, or a plastic material. The second light emission control semiconductor layer 131f and the first boosting storage plate 133 are formed in a polysilicon layer. Further, the driving semiconductor layer 131a includes a channel region 135, which is not doped with impurities, and a source region 136 and a drain region 137 channel formed aside the channel region 135 which are p+ doped. The impurity may be changed according to a type of the thin film transistor.

A gate insulating layer 140 made of silicon nitride (SiNx) or silicon oxide (SiO$_2$) is formed on the second light emission control semiconductor layer 131f.

A gate wire gate including a scan line 121 having a switching gate electrode 125b and a compensation gate electrode 125c, a previous scan line 122 having an initialization gate electrode 125d, and a light emission control line 123 having a driving gate electrode 125a and a second light emission control gate electrode 125f is on the insulating layer 140. Moreover, the second light emission control gate electrode 125f overlaps with at least a part of the second light emission control semiconductor layer 131f, particularly, with a channel region 135. The gate wire further includes a second storage plate 127 constituting the storage capacitor Cst, and the second boosting storage plate 129 constituting a boosting capacitor Cb.

The second storage plate 127 is connected to the driving voltage line 172 through a contact hole 168, and the second boosting storage plate 129 is connected to the scan line 121.

An interlayer insulating layer 160 covering the second light emission control gate electrode 125e is formed on the gate insulating layer 140. Both of the gate insulating layer 140 and the interlayer insulating layer 160 include a contact hole 163 exposing a drain region of the second light emission control semiconductor layer 131f. The interlayer insulating layer 160 is made of a ceramic-based material such as silicon nitride (SiNx) or silicon oxide (SiO$_2$) as in the gate insulating layer 140.

A data wire including a data line 171 having a switching source electrode 176b, a connection member 174, and the second light emission control drain electrode 177f, and driving voltage line 172 is on the interlayer insulating layer 160.

Further, the switching source electrode 176b and the second light emission control drain electrode 177f are connected to a source region of the switching semiconductor layer 131b and a drain region of the second light emission control semiconductor layer 131f through contact holes 162 and 163 which are formed in the interlayer insulating layer 160 and the gate insulating layer 140, respectively.

A protective layer 180 covering data wires 171, 174, 177f, and 172 is formed on the interlayer insulating layer 160, and a pixel electrode 190 and a haptic control line 410 are formed on the protective layer 180. A pixel electrode 190 is connected to the second light emission control drain electrode 177f through a contact hole 182, which is formed in the protective layer 180.

The haptic member 510 is formed between the scan line 121 and the haptic control line 410, and the haptic members 510 are filled in haptic holes 161 and 181 which are formed in the interlayer insulating layer 160 and the protective layer 180 between the scan line 121 and the haptic control line 410. Since there is the same number of haptic control lines 410 as the data lines 171, there can be the same number of haptic members 510 as pixels.

When there is a difference in voltage between the scan line 121 at a lower portion of the haptic member 510 and the haptic control line 410 at an upper portion of the haptic member 510, the height of the haptic member 510 is changed by Coulomb force due to polarization of EAP constituting the haptic member 510. This causes haptic vibration by changing the height of the haptic member 510.

In this manner, the haptic control line 410 and the haptic member 510 are formed inside the display device. Accordingly, since a separate haptic actuator is not required, the haptic display device can be miniaturized and slimmed, and can be used in a flexible display device.

A barrier rib 350 is formed at an edge of the pixel electrode 190 and on the protective layer 180, and the barrier rib 350 has a barrier rib opening 351 exposing the pixel electrode 190. The barrier rib 350 can be made of polyacryl-based resin (polyacrylates resin) and polyimide-based resin or a silica-based-inorganic material.

An organic emission layer 720 is formed on the pixel electrode 190 exposed through the barrier rib opening 351, and a common electrode 270 is formed on the organic emission layer 720. In this manner, the organic light emitting diode (OLED) 70 including the pixel electrode 190, the organic emission layer 720, and the common electrode 270 is prepared.

The pixel electrode 190 is an anode serving as a hole injection electrode, and the common electrode 270 is a cathode serving as an electron injection electrode. That is, the pixel electrode 190 may become the cathode, and the common electrode 270 may become the anode according to a driving method. Holes and electrons from the first electrode 190 and the second electrode 270 are injected into the organic emission layer 720, respectively. Light emission is achieved when an exciton including injected holes and electrons is changed from an exited state to a ground state.

The organic emission layer 720 is made of a low molecular organic material or a polymeric organic material such as Poly 3,4-ethylenedioxythiophene (PEDOT). Further, the organic emission layer 720 may be formed in a multilayer including at least one of an emission layer, a hole injection layer (HIL), a hole transport layer (HTL), an electron transport layer (ETL), and an electron injection layer (EIL). When the organic emission layer 720 includes all the above layers, the hole injection layer (HIL) is disposed on the first electrode 190 serving as an anode, and the hole transport layer (HTL), the emission layer, the electron transport layer (ETL), and electron injection layer (EIL) are sequentially laminated on the hole injection layer (HIL). Since the common electrode 270 is made of a reflective conductive material, a bottom-light emitting organic light emitting diode (OLED) display is provided. A reflective material may use a material such as lithium (Li), calcium (Ca), lithium fluoride/calcium (LiF/Ca), lithium fluoride/aluminum (LiF/Al), aluminum (Al), silver (Ag), magnesium (Mg), or gold (Au).

According to at least one of the disclosed embodiments, the haptic control line and the haptic member are formed inside the haptic display device, so that the haptic display device can be miniaturized and slimmed. In addition, since a separate haptic actuator is not required, at least one of the disclosed embodiments is applicable to a flexible display device. Further, since the same number of haptic members is used as the number of pixels, a resolution of a haptic display device is improved.

While the above embodiments have been described in connection with the accompanying drawings, it is to be understood that the invention is not limited to the disclosed embodiments, but, on the contrary, is intended to cover various modifications and equivalent arrangements included within the spirit and scope of the appended claims.

What is claimed is:

1. A haptic display device comprising:
    a substrate;
    a plurality of scan lines disposed over the substrate and configured to transfer a scan signal;
    a plurality of data lines spaced apart from the scan lines and configured to transfer a data signal, wherein the data lines cross the scan lines;
    a plurality of driving power lines spaced apart from the scan lines and configured to transfer a driving voltage, wherein the driving power lines cross the scan lines;
    a plurality of haptic control lines spaced apart from the scan lines or the data lines and configured to transfer a haptic signal;
    a plurality of haptic members configured to change a height thereof based at least in part on the haptic signal;
    a thin film transistor electrically connected to at least one of the scan lines and the corresponding data line, wherein the thin film transistor is formed in each of a plurality of pixels arranged in a matrix pattern;
    a first electrode electrically connected to the thin film transistor;
    a second electrode facing the first electrode;
    an optical adjustment member disposed between the first and second electrodes;
    an insulating layer formed between the haptic control lines and the scan line; and
    a barrier rib covering an edge of the first electrode and disposed on the insulating layer,
    wherein the plurality of haptic members overlap the barrier rib,
    wherein the insulating layer is a protective layer covering the data lines,
    wherein each of the haptic control lines is provided on a same layer with the first electrode and is separated from the first electrode.

2. The haptic display device of claim 1, wherein the haptic control lines are substantially parallel with the data lines.

3. The haptic display device of claim 2, wherein each of the plurality of haptic members is disposed at a crossing region between each of the haptic control lines and the corresponding scan line.

4. The haptic display device of claim 3, wherein the number of the haptic members is the same as the number of the data lines.

5. The haptic display device of claim 3, wherein the number of the haptic members is less than the number of the data lines.

6. The haptic display device of claim 3, wherein the number of the haptic control lines is the same as the number of the data lines.

7. The haptic display device of claim 3, wherein the number of the haptic control lines is less than the number of the data lines.

8. The haptic display device of claim 2, wherein each of the plurality of haptic members is disposed between each of the haptic control lines and the second electrode.

9. A haptic display device comprising:
    a substrate;
    a plurality of scan lines disposed over the substrate and configured to transfer a scan signal;
    a plurality of data lines spaced apart from the scan lines and configured to transfer a data signal, wherein the data lines cross the scan lines;
    a plurality of haptic control lines spaced apart from the scan lines or the data lines and configured to transfer a haptic signal;
    a thin film transistor electrically connected to a selected one of the scan lines and the corresponding data line, wherein the thin film transistor is formed in each of a plurality of pixels arranged in a matrix pattern;
    a first electrode electrically connected to the thin film transistor;
    a second electrode facing the first electrode;
    an optical adjustment member disposed between the first and second electrodes, wherein the substrate is formed below the haptic control lines and at least one of the scan lines;
    a plurality of haptic members each of which is formed between a haptic control line of the plurality of haptic control lines and the corresponding data line; and
    a barrier rib covering an edge of the first electrode,
    wherein the plurality of haptic members overlap the barrier rib,
    wherein the insulating layer is disposed on the same layer as the haptic members,
    wherein each of the haptic control lines is provided on a same layer with the scan line and is separated from the scan line.

10. A haptic display device comprising:
    a substrate;
    a plurality of scan lines disposed over the substrate and configured to transfer a scan signal;

a plurality of data lines spaced apart from the scan lines and configured to transfer a data signal, wherein the data lines cross the scan lines;
a plurality of haptic control lines spaced apart from the scan lines or the data lines and configured to transfer a haptic signal;
a thin film transistor electrically connected to a selected one of the scan lines and the corresponding data line, wherein the thin film transistor is formed in each of a plurality of pixels arranged in a matrix pattern;
a first electrode electrically connected to the thin film transistor;
a second electrode facing the first electrode;
an optical adjustment member disposed between the first and second electrodes; and
a barrier rib covering an edge of the first electrode,
wherein the substrate is formed below the haptic control lines and at least one of the scan lines,
wherein each of the haptic control lines is provided on a same layer with the scan line and is separated from the scan line, wherein the haptic control line is provided parallel with the scan line, wherein a haptic member is provided between the haptic control line and the first electrode, and wherein the plurality of haptic members overlap the barrier rib.

11. A haptic display device comprising:
a substrate;
a plurality of scan lines disposed over the substrate and configured to transfer a scan signal;
a plurality of data lines spaced apart from the scan lines and configured to transfer a data signal, wherein the data lines cross the scan lines;
a plurality of haptic control lines spaced apart from the scan lines or the data lines and configured to transfer a haptic signal;
a thin film transistor electrically connected to a selected one of the scan lines and the corresponding data line, wherein the thin film transistor is formed in each of a plurality of pixels arranged in a matrix pattern;
a first electrode electrically connected to the thin film transistor;
a second electrode facing the first electrode;
an optical adjustment member disposed between the first and second electrodes; and
a barrier rib covering an edge of the first electrode, wherein the substrate is formed below the haptic control lines and at least one of the scan lines,
wherein each of the haptic control lines is provided on a same layer with the scan line and is separated from the scan line, wherein the haptic control line is provided parallel with the scan line, wherein a haptic member is provided between the haptic control line and the second electrode, and wherein the plurality of haptic members overlap the barrier rib.

12. A haptic display device comprising:
a substrate;
a plurality of scan lines disposed over the substrate and configured to transfer a scan signal;
a plurality of data lines spaced apart from the scan lines and configured to transfer a data signal, wherein the data lines cross the scan lines;
a plurality of haptic control lines spaced apart from the scan lines or the data lines and configured to transfer a haptic signal;
a plurality of haptic members configured to change a height thereof based at least in part on the haptic signal;
a thin film transistor electrically connected to at least one of the scan lines and the corresponding data line, wherein the thin film transistor is formed in each of a plurality of pixels arranged in a matrix pattern;
a first electrode electrically connected to the thin film transistor;
a second electrode facing the first electrode;
an optical adjustment member disposed between the first and second electrodes;
an insulating layer formed between the haptic control lines and the substrate; and
a barrier rib covering an edge of the first electrode,
wherein the insulating layer is an interlayer insulating layer covering and directly contacting the scan lines,
wherein each of the haptic control lines is provided on a same layer with the data line and is separated from the data line, wherein each haptic member is disposed between the first electrode and a selected one of the data lines in a plan view, and wherein the plurality of haptic members overlap the barrier rib.

13. The haptic display device of claim 12, wherein the haptic control line is provided parallel with the data line.

14. The haptic display device of claim 13, wherein each of the plurality of haptic members is disposed between the respective scan line and the respective haptic control line.

15. A haptic display device comprising:
a substrate;
a plurality of scan lines disposed over the substrate and configured to transfer a scan signal;
a plurality of data lines spaced apart from the scan lines and configured to transfer a data signal, wherein the data lines cross the scan lines;
a plurality of driving power lines spaced apart from the scan lines and configured to transfer a driving voltage, wherein the driving power lines cross the scan lines;
a plurality of control lines spaced apart from the scan lines or the data lines and configured to transfer a signal;
a plurality of piezo members configured to change a height thereof based at least in part on the signal;
a switching thin film transistor electrically connected to at least one of the scan lines and the corresponding data line;
a driving transistor electrically connected to the switching thin film transistor and a selected one of the driving power lines;
a first electrode electrically connected to the driving transistor;
an organic light emitting diode disposed on the first electrode;
a second electrode disposed on the organic light emitting diode;
an insulating layer formed between the control lines and the substrate; and
a barrier rib covering an edge of the first electrode and disposed on the insulating layer,
wherein the plurality of haptic members overlap the barrier rib,
wherein the insulating layer is a protective layer covering the data lines,
wherein each of the control lines is provided on a same layer with the first electrode and is separated from the first electrode.

16. The haptic display device of claim 15, wherein the control lines are substantially parallel with the data lines.

17. The haptic display device of claim 16, wherein each of the plurality of haptic members is disposed at a crossing region between each of the control lines and the corresponding scan line.

* * * * *